(12) United States Patent
Salmon

(10) Patent No.: US 7,522,274 B2
(45) Date of Patent: Apr. 21, 2009

(54) RADIOMETERS

(75) Inventor: Neil A Salmon, Malvern (GB)

(73) Assignee: QinetiQ Limited, Farnborough, Hants (GB)

( * ) Notice: Subject to any disclaimer, the term of this patent is extended or adjusted under 35 U.S.C. 154(b) by 0 days.

(21) Appl. No.: 11/642,741

(22) Filed: Dec. 21, 2006

(65) Prior Publication Data

US 2007/0121103 A1    May 31, 2007

Related U.S. Application Data

(62) Division of application No. 10/467,798, filed as application No. PCT/GB02/00745 on Feb. 21, 2002, now abandoned.

(30) Foreign Application Priority Data

Feb. 21, 2001    (GB)    ................... 0104206.8

(51) Int. Cl.
    *G01J 1/56* (2006.01)
(52) U.S. Cl. ...................... 356/216; 356/218
(58) Field of Classification Search ................. 356/216, 356/218, 221; 342/351, 369, 179; 348/135, 348/143, 145
    See application file for complete search history.

(56) References Cited

U.S. PATENT DOCUMENTS

| | | | |
|---|---|---|---|
| 2,724,995 A | 11/1955 | Matner | |
| 3,895,182 A | 7/1975 | Trilling | |
| 4,173,772 A | 11/1979 | White | |
| 4,419,692 A | 12/1983 | Modisette et al. | |
| 4,438,457 A * | 3/1984 | Tandon et al. | ............... 348/316 |
| 4,515,443 A | 5/1985 | Bly | |
| 4,654,666 A | 3/1987 | Wiley | |
| 4,825,078 A | 4/1989 | Huber et al. | |

(Continued)

FOREIGN PATENT DOCUMENTS

DE    2 911 363    9/1980

(Continued)

OTHER PUBLICATIONS

Lettington et al., "Compact Mechanically Scanned Antennas for Real-Time Passive-Millimerre-Wave Imaging," IEE Proc.-Microw, Antennas Propag, vol. 147, No. 5, Oct. 2000.

*Primary Examiner*—L. G Lauchman
(74) *Attorney, Agent, or Firm*—Nixon & Vanderhye P.C.

(57) ABSTRACT

Radiometers detect radio wavelength electromagnetic radiation and typically have an antenna (16), an amplifier (18) and a detector (20). All three of these components have response characteristics that may be dependent on temperature, and in the case of systems using radiometer arrays dependent upon temperatures throughout the system. Different temperatures across a multi-channel antenna and differential channel temperature response can result in poor image quality from imaging radiometers. Resolution of a linear array of detector horns is limited by the size of the horns. An imaging radiometer (10) uses a focusing polariser (36), a quarter wave plate (32), a rotating inclined disk (28), and a detector feed array (16) to perform a conical scan, and compensates for variation in operating temperature of a radiometer using one or more of a variety of techniques including calibrating channels relative to each other, calibrating channels using reference temperatures in-situo, and calibrating channels using temperature response predictions stored in the radiometer signal processor (22). Aspects of the invention also optimise image resolution, image quality and allow calibration.

6 Claims, 11 Drawing Sheets

U.S. PATENT DOCUMENTS

| | | | |
|---|---|---|---|
| 4,862,185 A | 8/1989 | Andrews et al. | |
| 4,864,308 A | 9/1989 | Raab et al. | |
| 4,989,086 A | 1/1991 | Schaff et al. | |
| 5,073,782 A * | 12/1991 | Huguenin et al. | 342/179 |
| 5,231,404 A | 7/1993 | Gasiewski | |
| 5,274,235 A * | 12/1993 | Taylor | 250/332 |
| 5,354,987 A | 10/1994 | MacPherson | |
| 5,512,748 A | 4/1996 | Hanson | |
| 5,760,397 A * | 6/1998 | Huguenin et al. | 250/332 |
| 6,057,799 A * | 5/2000 | Martin-Neira et al. | 342/351 |
| 6,166,831 A | 12/2000 | Boyd et al. | |
| 6,175,113 B1 | 1/2001 | Elliott et al. | |
| 6,353,224 B1 * | 3/2002 | Sinclair et al. | 250/336.1 |
| 6,587,246 B1 * | 7/2003 | Anderton et al. | 359/212 |

FOREIGN PATENT DOCUMENTS

| | | |
|---|---|---|
| EP | 0 391 128 | 10/1990 |
| EP | 0 439 912 | 8/1991 |
| EP | 0 443 284 | 8/1991 |
| EP | 0 468 474 | 1/1992 |
| EP | 0 476 243 | 3/1992 |
| EP | 0 507 526 | 10/1992 |
| EP | 0 647 064 | 4/1995 |
| FR | 2 553 882 | 4/1985 |
| GB | 2 100 548 | 12/1982 |
| GB | 2 183 057 | 5/1987 |
| GB | 2 191 059 | 12/1987 |
| GB | 2 225 914 | 6/1990 |
| GB | 2 346 980 | 8/2000 |
| JP | 64-0009372 | 1/1989 |
| JP | 050133812 | 5/1993 |
| WO | WO 85/05464 | 12/1985 |
| WO | WO 94/00950 | 1/1994 |
| WO | WO 95/01048 | 1/1995 |
| WO | WO 95/14948 | 6/1995 |
| WO | WO 98/47020 | 10/1998 |
| WO | WO 00 14587 | 3/2000 |
| WO | WO 00/52435 | 9/2000 |

* cited by examiner

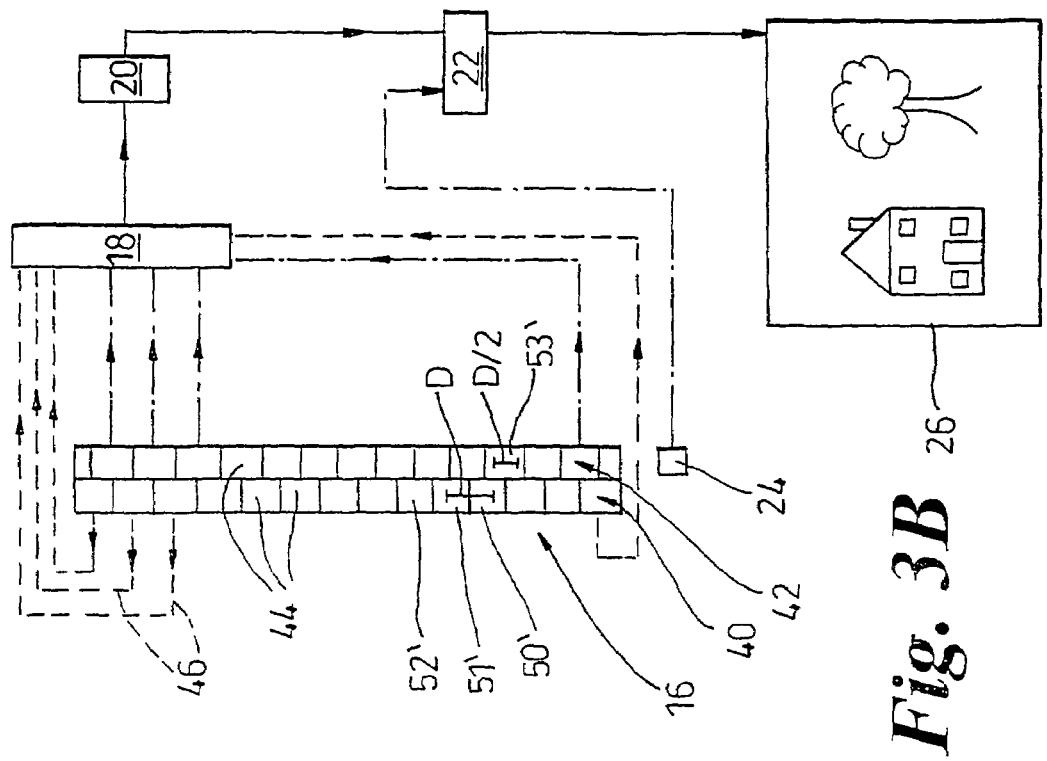
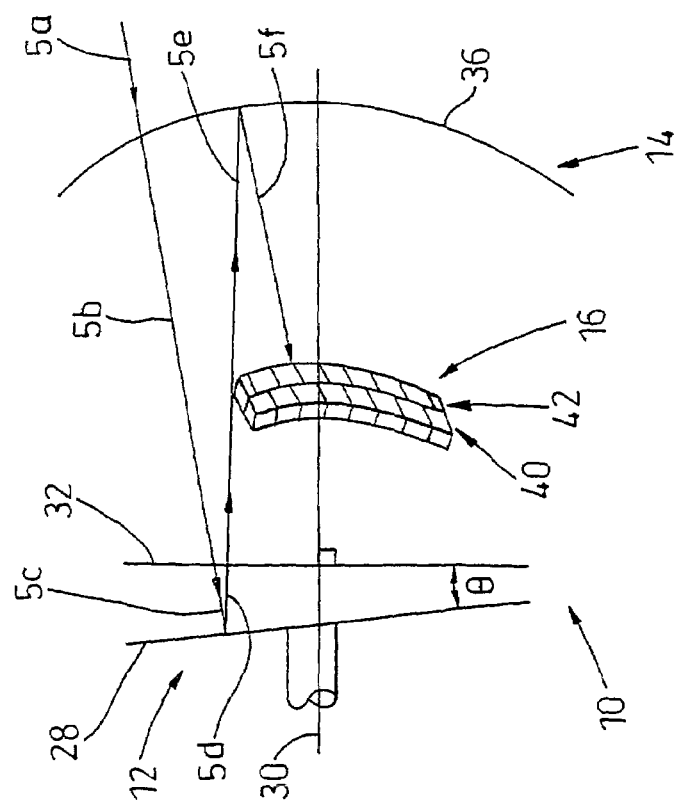
Fig. 3A
Fig. 3B

RADIOMETERS

This application is a Divisional of application Ser. No. 10/467,798, filed Aug. 12, 2003, now abandoned which is the US national phase of International Application PCT/GB02/00745, filed in English on 21 Feb. 2002, which designated the US. PCT/GB02/00745 claims priority to GB Application No. 0104206.8 filed 21 Feb. 2001. The entire contents of these applications are incorporated herein by reference.

This invention relates to radiometers, especially but not exclusively imaging radiometers, real time passive mm wave imagers, and quarter wave plate passive millimeter wave imagers.

Radiometer scanner arrangements have different known configurations, and size of scanner is a consideration.

Radiometers detect radio wavelength electromagnetic radiation and typically have an antenna, an amplifier and a detector. An imaging radiometer (or passive millimeter wave imager) will have in addition focusing optics. All the components have response characteristics that may be dependent on temperature, and in the case of the antenna dependent upon differences in temperature across the receiver array. Different temperatures across a multi-channel receiver array and differential channel temperature response can result in poor image quality.

Due to the fact that the output signals of the detector of a radiometer are to some extent dependent upon the temperature of the radiometer, and differences in temperature over the radiometer, it is necessary to calibrate the radiometer to compensate or modify the output signals from the detector to obtain more reliable images of a scene. A radiometer will typically have a main laboratory or factory calibration periodically to re-set it (for example every 4 months or so). This typically involves pointing the antenna at a hot source of known temperature (e.g. room ambient temperature), and pointing it at a cold source of known temperature (e.g. liquid nitrogen). Software in the radiometer can then perform a main base calibration, setting the gain and offset voltage to be applied to the output voltage of the detector.

However, the gain and offset of a channel of a radiometer varies with the temperature of the radiometer at the time of using it, and this effect can alter the gain by as much as 30%. There are other factors which can alter the gain and offset, but temperature can be a major variable factor. Ambient temperature changes can cause significant problems for imaging radiometers. Even more importantly for an imaging radiometer is the fact that different antenna channels (or the same antenna channel at different times) can have different temperatures, which can cause distortion of the output voltage of the detector(s) and hence image distortion. Furthermore, the amplifier can have different temperatures at different times during the detection process and this will influence the output voltage of the detector.

It is known to alleviate the above problems in a number of ways. One way is to strive to maintain the temperature of the temperature-sensitive components of the radiometer constant during operation of the radiometer so that only changes in temperature seen by the detector due to incident radiation (i.e. the mm wave radiation being detected) cause variation in detector output voltage. This approach works: it is possible to provide the radiometer in a controlled environmental chamber and to maintain the whole radiometer at a carefully controlled temperature, for example a stable elevated temperature (elevated in comparison with typical ambient temperatures). However, the device is then not very user-friendly, and the external chamber heating and/or cooling mechanism, and their servo controls, are complex and expensive, and susceptible to mechanical failure or damage. The device also has extra weight and bulk.

Another approach is to compare the scene signals with a reference signal and use that reference to re-calibrate the radiometer periodically. The radiometer may be re-calibrated between each frame of an imaging radiometer. The reference signal could be provided by a chopper, but this typically halves the sensitivity of the device (because the detectors spend half of their time looking at a reference chopper). Alternatively it is known to inject an electronic noise signal from a resistor into the detector signal, and to use this noise as a reference signal. However, the gain of the amplifier used in the noise source may change with temperature, and so the reference signal may not be as stable as is desirable.

Other problems experienced by radiometers are that for mm wave radiometers, their detector feed horns are a finite size and this limits how closely they can be spaced in a linear array. Furthermore, it is sometimes desired to have more information content/discrimination in the signal between notional pixels in an observed scene.

There is a pixel interrogation time in a scanning radiometer: if it is too long the data can be unreliable due to changes in the observed scene. It is therefore desirable to keep the pixel integration time of the radiometer detector short.

It is an aim of the invention to provide a new radiometer. The radiometer may at least ameliorate at least one of the aforesaid difficulties. It is an aim of one embodiment of the invention to provide a radiometer with improved calibration features to compensate for temperature fluctuation, and optionally to provide the calibration/compensation with no or few moving parts, and without adding significantly to the mass or size of the device.

It is an aim of another embodiment of the invention to improve resolution and/or picture quality.

Quarter Wave Plate Scanner

According to first aspect the invention comprises a scanning imaging radiometer comprising scanner components, a detector, and a control processor adapted to control the operation of the scanner components; wherein the scanner components comprise a focusing element adapted in use to focus radiation onto the detector, a detector field of view director comprising a reflector plate rotatable about an axis of rotation with the plane of the reflector plate being inclined relative to the normal of the axis of rotation, and a quarter wave plate provided disposed between the reflector plate and the focusing element; and wherein the detector has a detector feed provided disposed between the focusing element and the reflector plate.

Preferably the detector feed is provided between the focusing element and the quarter wave plate. Preferably the quarter wave plate comprises a meanderline device.

Preferably the focusing element also comprises a polariser adapted in use to transmit radiation of one polarisation (e.g. of a first plane of polarisation) and to reflect radiation of the orthogonal polarisation.

The detector preferably comprises an array of feed elements. Each detector preferably receives radiation from a particular part of the observed scene. The detector field of view director preferably, in use, directs radiation from a particular part of the observed scene to a detector feed (or from respective different parts of the observed scene to respective different individual detector feeds).

Preferably the reflector is disposed closer to a scene-observing aperture of the radiometer than the detector, quarter wave plate, and reflector plate. Preferably, in order of physical position relative to an image-capturing aperture, the focusing element is closest, followed by the detector, followed by the quarter wave plate, followed by the reflector plate.

Preferably the radiometer is a conical scanner (selects circles or annuli in space in a scene being observed and focuses points or sections (regions/areas defined by the optics of the device) disposed on different annuli onto respective individual detector elements of the detector array, different points (micro-areas) on any one annulus being focused onto the same detector element, but at different moments in time. The conical scanner directs points/micro areas from a single annulus onto an individual detector element using the field of view director and focusing optics.

The focusing element may comprise a polariser, possibly a linear polariser, but it could be another form of polariser, for example a circular polarisation device. The focusing element may focus radiation with a first linear polarisation and not radiation with a polarisation displaced by 90°. The focusing element may comprise a dish of generally parallel wires. The focusing element may be disposed in front of the detector feed in relation to a scene capturing aperture of the radiometer. A polarisation changing element may be provided between the reflector and the focusing element, and may comprise a meanderline device.

Offset Array

According to another aspect the invention comprises a scanning radiometer having a detector array, a scanner, and a control processor adapted to receive signals from the detector array, in which the detector array has an elongate length, or curve, and detector array feed elements each feeding respective channels, said feed elements being spaced along the elongate length, or curve, of the array, and in which the scanner is in use controlled by the control processor to scan regions of an observed scene over the detector array, and in which the detector array comprises a first line or curve of feed elements with their centres spaced apart by a first distance and a second line, or curve, of feed elements with the centres of feed elements of the second line, or curve, spaced apart by a second distance, the centres of the first and second lines, or curves, of detector elements being offset from each other in the elongate direction of the first line, or curve.

The lines of feed elements need not be straight: they could be curved.

The curves of curved detector arrays can be adjacent straight linear arrays or adjacent annular arrays. In the case of linear arrays the scan pattern in the imager will be linear displaced circles, and in the case of annular arrays the scan pattern will be annular displaced circles. The advantage of the annular array is that more samples are taken in the centre of the image. The advantages of the linear array is that it is easier to make.

The feed elements of a line, or curve, will usually be equidistantly spaced from each other, but might not be. The spacing of the feed elements of the first line, or curve, will usually be the same as the spacing of the feed elements along the second line, or curve, but might not be.

Preferably the second line, or curve, extends generally parallel to the first line. Preferably the first and second lines, or curves, of detector feeds are adjacent to each other, most preferably substantially as close to each other as the geometry of the feed elements permits. Preferably the first distance is substantially as small as the geometry of the feed elements permits. Preferably the first and second feed elements have substantially the same size. Preferably the first and second lines, or curves, comprise lines of substantially identical feed elements spaced substantially as close as possible to adjacent feed elements in their own line, or curve, and with the two lines, or curves, substantially as close as possible to each other, with an offset in the relative positions of the first and second lines, or curves, in their elongate direction.

Having the detector elements as close as possible improves the resolution of the device.

The result of offsetting the detector elements in the second line relative to the detector elements in the first line with the two lines being in nearly the same place in space, is effectively to produce a multi-line array which is equivalent to a single line array, but with closer feed element spacing in the elongate direction of the array.

There is a limit to how close the centres of two feed elements can be. They are typically rectangular horns and have a finite size. This can put a constraint on how close together the horns can be in a line, which in turn constrains the resolution of the device.

Offsetting the horns/fields of adjacent lines of horns/feeds effectively reduces the line spacing between the centre of two horns (the distance in the elongate direction between the horn centres).

The offset may be ½ pitch offset. This effectively halves the inter-feed spacing in the elongate direction. Alternatively a different offset may be used (e.g. ¼ or ⅓ pitch).

There may be only two lines of feed elements, but it is not necessary to have only two lines of feed elements; more than two lines can be envisaged e.g. 3, 4 etc. If there are n similar lines of feed elements then the offset, the feed spacing, in the linear direction between the centres of feed elements in the lines may be 1/n of the pitch.

The direction of scanning of the scene over the detector array may be substantially perpendicular to the elongate direction of the detector element lines. In non straight arrays the elongate direction may be a local elongate direction, local to a few, or possibly only two, feed elements of the array. For example for any two adjacent feed elements in a line (curved) of feed elements there may be a line between them, and an offset feed element from a different line may be disposed in that gap, when viewed projected along the line of radiation incident upon the two adjacent feed elements.

The offset between centres of feed elements of different lines of feed elements may be such as to reduce the effective inter-feed element centre spacing in the elongate direction to Nyquist spacing, or near Nyquist spacing, or better than Nyquist spacing.

The Nyquist spacing does of course depend upon the frequency of radiation being used. It is envisaged that the centre of the feed elements of a single line might be about $\lambda Fn$ apart, and that the Nyquist spacing for radiation of interest might be $$\frac{\lambda}{2} Fn,$$

which means that two lines of feed elements at ½ pitch spacing should produce a system with about Nyquist spacing (where $\lambda$ is the free space wavelength of the radiation and Fn is the F number of the focusing optics, and $$Fn = \frac{\text{focal length}}{\text{diameter of optics}}).$$

The radiometer is preferably an imaging radiometer.

According to another aspect the invention comprises a method of improving the resolution of an imaging radiometer of the kind having a linear array of detector feed elements and a scanner which scans an observed scene over the linear array in a direction transverse to the linear direction of the array, the method comprising providing an array having a plurality of lines of detector elements, with the lines being offset in the linear direction of the lines so that as seen along the linear direction of the array as a whole the spacing of detector feeds is smaller than that found in a single line of feed elements, thereby effectively reducing the spacing of detector feed elements in the linear direction of the detector array.

Calibration

According to another aspect the invention comprises a radiometer having at least one detection channel and a detector adapted to receive radiation acquired in use by the channel, a control processor, and an absolute reference temperature provider, the arrangement being such that the radiometer can be put, in use, in a calibration mode in which it resets the gain and/or offset associated with the, at least one, or each, channel by using signals derived from the reference temperature provider.

Preferably the absolute reference temperature provider comprises a holder for holding a substance of known temperature.

There may be two (or more) different absolute reference temperature providers, adapted to present different known temperatures to the radiometer.

The reference temperature provider may include a temperature sensor adapted to provide signals indicative of the temperature of the reference temperature provider to the control processor. The reference temperature provider(s) may comprise a thermo-electric device.

The radiometer may have an array of detector feed elements and the or each reference temperature provider may be provided adjacent to the detector feed array. Preferably the detector feed array and its read-out connections extend away from the detector elements and are disposed in part of the optical path of radiation that enters the radiometer's image-acquiring aperture, and preferably the reference temperature provider(s) are disposed in the same projected position as the read out connections. This may minimize further disruption/degradation of the scene radiation captured by the radiation since the reference temperature provider(s) obscure only the same path (or substantially the same path) as the read out wiring.

Preferably the radiometer has a switch adapted to cause the detector array to detect radiation from the reference temperature provider instead of from the scene. The switch may comprise a polarization altering component adapted to have a scene-observing position and a reference-temperature observing position. The switch may be moved angularly between the reference temperature and scene observing positions. The switch may comprise a quarter wave plate. The switch may comprise a meanderline device. The meanderline device or ¼ plate may have a fast or slow axis aligned with the plane of linearly polarised radiation during reference temperature measurement and aligned at 45° disposed to this when measuring scene radiation.

The radiometer may have a meanderline plate which for normal imaging of a scene is downstream of a linear polarizer and has its fast or slow axis inclined at 45° to the plane of polarization of radiation from the scene that has been linearly polarized prior to interacting with the meanderline plate, and which when in reference temperature observing mode has its fast or slow axis generally parallel to the plane of polarization of the radiation incident upon it.

The polarizing reflector may be rotated by 90° on its axis to switch the passive millimeter wave imaging from its normal imaging to one where all radiation channels view essentially unfocussed radiation from the scene which has effectively the same radiation temperature.

Preferably a reflector, possibly inclined relative to an axis of rotation of the reflector, is provided downstream of the meanderline device. Preferably a linear polarizer is provided upstream of the meanderline device. The linear polarizer may also focus radiation onto the detector array.

Modifying Gain/Offset

According to another aspect the invention comprises a method of improving the image quality of a multi-channel imaging radiometer having at least a first channel which detects radiation using a first detector and a second channel which detects radiation using a second detector, the method comprising modifying the gain and/or offset used in the scene-temperature vs detector voltage equations for the first and second channels using values for the gain and offset derived by performing a channel calibration operation, and in that channel calibration operation ensuring that the first and second channels observe substantially the same temperature and using the outputs from the first and second detectors in the calibration operation to produce a modified value for the gain and/or offset for the first and/or second channel; the radiometer using the modified gain and/or offset for the first and/or second channel to create an image using the first and second channels.

Preferably the first and second channels observe substantially the same scene temperature. Of course, the first and second channels may be physically next to each other in a detector array, but they need not be: they could be spaced apart physically and there could be other channels in between them. "First" and "second" channels could be read as "a channel" and "another different channel".

Thus the factory/laboratory set gain and offset voltage for the first channel, and for the second channel, are re-evaluated in a relative channel calibration operation. It will be appreciated that the gain and offset for one channel could be left alone, as a reference, base level, and the gain and offset of the second channel set relative to that. Alternatively, the gain and offset of both channels could be modified/reset.

Preferably a third channel, or further channels, has its or their gain and offset calibrated relative to the first or second channel by use of a channel calibration operation in which two channels observe substantially the same temperature and the detector signals from them are used to calibrate the gain and offset of one channel relative to the other.

Usually, both the gain and offset of a channel will be modified in the relative calibration operation, but sometimes it may be necessary to modify only one of them, depending upon what the equations produces as the relative gains and offsets.

The two channels may conveniently observe the same temperature in the calibration operation by observing substantially the same point in space in the scene being observed at substantially the same time. Usually, there will be a slight time difference between first and second channel observations of the same point, but the temperature of that point in the scene can be taken to be constant if the time difference is small enough.

Preferably, the calibration operation comprises observing with the first and second channels a first temperature, the same temperature for each channel, and a second temperature, the same temperature for each channel, the second temperature being different from the first temperature. By having two different observed temperatures with the two channels, with the first and second channels each having a respective detector signal response that is dependent upon gain and offset, it is possible to solve the response equations for the relative gain and relative offset.

The temperature of the observed temperature may be known, for example because it is measured in some way, or it may be evaluated by the radiometer, for example using the factory setting for a channel's gain and offset. This observed temperature value may be used in the process of determining the relative gains and offsets of the channels. The observed temperature value used may be an average or a weighted function of the observed value temperature of the individual channels that are observing the same temperature.

The relative calibration operation may use the equations:

Voltage of Detector 1=gain of channel 1×observed Temperature(channel 1)+Voltage offset for channel 1                                                                              (i)

and

Voltage of Detector 2=gain of channel 2×observed temperature(channel 2)+Voltage offset for channel 2                                                                              (ii)

to determine one or more, or all, of: gain of channel 1, gain of channel 2, offset of channel 1, and offset of channel 2.

Preferably equations (i) and (ii) are repeated for two different temperatures, observed temperature 1 and observed temperature 2, which gives four equations:

$$V_{Det\ Channel\ 1\ point\ A} = g_1(t) \times T_{observed\ A} + V_{01}(t) \quad \text{(equation a)}$$

$$V_{Det\ Channel\ 2\ point\ A} = g_2(t) \times T_{observed\ A} + V_{02}(t) \quad \text{(equation b)}$$

$$V_{Det\ Channel\ 1\ point\ B} = g_1(t) \times T_{observed\ B} + V_{01}(t) \quad \text{(equation c)}$$

$$V_{Det\ Channel\ 2\ point\ B} = g_2(t) \times T_{observed\ B} + V_{02}(t) \quad \text{(equation d)}$$

and the method comprises solving the equations to determine the four unknown variables $g_1$, $V_{01}$, $g_2$, $V_{02}$ (with $T_{observed\ A}$ and $T_{observed\ B}$, and the detector voltages known).

Preferably the relative calibration of the first and second channels takes place periodically in use of the radiometer, preferably automatically periodically, but a user may be able to initiate calibration manually (e.g. by pressing a button), or may be able to set the frequency of calibration. The radiometer may perform the relative channel calibration at intervals of the order of:

(i) 50 ms or 100 ms; or
(ii) 1 second or a few seconds; or
(iii) 10 seconds or tens of seconds; or
(iv) a minute or few minutes; or
(v) ten minutes or more; or
(vi) between the construction of successive images; or
(vii) between every 1, 2, 3, 4, 5, 10, 20, 30, 40, 50, or more, images.

The method may comprise scanning a first track or path of an observed scene onto the first channel and scanning a second track or path of an observed scene onto the second channel, and intersecting the paths. At the point of intersection the two channels are looking at a common point in the scene.

Preferably the two tracks intersect at two, or two or more spaced apart points in the observed scene. It can be assumed that the two spaced apart points will be at different temperatures. This will be true for many observed scenes.

Preferably the method comprising checking the pre-modification values for the temperature being observed by the first and second channels to ensure that they are close enough to each other to be considered to be two channels measuring the same temperature.

If the two pre-modification values of the observed scene temperature are outside of an allowable margin for their difference the radiometer may not re-calibrate those channels that time. If such an event happens the radiometer may re-calibrate at a shorter interval, if all channels are assessed for relative calibration are relatively calibrated.

The temperature of the scene evaluated by each of the two channels may be evaluated by a processor to determine whether the observed scene temperature had varied between the time that the first channel observed it and the second channel observed it. Temperature evaluated from a channel may be compared with the previous scene T for that channel, or the scene T if evaluated using the other channel signal (or its own previous signal) to be used. If the processor decides that a temperature signal is suspect it may decide not to relatively calibrate the two channels on that decision.

The method may comprise making the two channels see the same temperature by defocusing. Focusing or imaging optics (by "optics" no restriction to optical wavelength is intended) may be defocused so as to ensure that the temperature seen by two channels is generally the same.

The method may comprise making the two channels see the same temperature by switching the radiation incident upon the detectors from being scene radiation to reference radiation. The reference radiation may be from a source associated with the radiometer. The reference radiation may be provided by providing a thermal source to be viewed by the channels. The thermal source may be provided at the imaging plane of the radiometer, possibly adjacent an imaging focal plane receiver feed array. The thermal source may be provided by a thermoelectric device to provide a thermal source of desired temperature. The temperature of the thermal source may be measured, and the temperature may be used to determine the gain and offset for the channels.

According to another aspect the invention comprises a method of compensating a multi-channel radiometer for variations in the output voltage of a detector with temperature of the radiometer, comprising modifying the gain and offset voltage used in the evaluation of an observed scene temperature by calibrating one channel's gain and offset relative to another channel's gain and offset.

Preferably the method comprises ensuring that the two channels observe the same temperature during a calibration operation. This may be achieved by having the channels observe the same point in the scene, or by having the channels observe a reference thermal source, or by defocusing the scene.

According to another aspect the invention comprises a multi-channel imaging radiometer having a first channel having a first channel detector and being adapted to be connected to a first channel observed scene radiation feed, and a second channel having a second channel detector and being adapted to be connected to a second channel observed scene radiation feed, and a signal processor, in which observed scene radiation signals are adapted to be fed to the first and second detectors respectively by their first and second channels, and the detectors are adapted in use to provide first and second detector outputs to the signal processor, the signal processor being adapted in use to provide output signals representative of the temperatures observed in the observed scene by the first and second channels; and in which the signal processor is adapted in use to operate on the received first and second detector outputs using values representative of, influenced by, or associated with the gain and voltage offset for the first channel and for the second channel to calibrate the gain and voltage offset for the second channel relative to those of the first channel.

Preferably the signal processor is adapted to use the equation:

$$V_{detector} = \text{gain} \times \text{observed scene temperature} + V_{offset},$$

or an equivalent, for each channel to determine the modified gain and offset.

The first and second channel detectors are preferably different detectors, but they may be one and the same detector.

Preferably the radiometer is adapted to scan an observed scene in such a way as to overlap or cross scan paths, so that the same point in the observed scene is viewed by more than one channel. The radiometer may be adapted to perform a conical scan pattern.

If the scene temperature changes between the relative calibration of two channels, or if it is predicted that it may change, then relative calibration may be suspended until such time as it can be taken as being constant. For example, if the imager is panning or tilting the point in space being observed by the channels will change between relative calibration measurements, and so the temperature can be predicted not to be constant. The radiometer may be arranged such that relative calibration between channels does not occur when the observed source is moved past the detector channels.

When a relative calibration is performed the gain and offset evaluated may be examined or checked by a processor or software to make sure that the gains and offsets evaluated for the channels are not wildly different from (a) each other and/or (b) their previous values. Allowable limits for differences may be used to screen evaluated gain and offset. It is, of course, not necessary to calibrate every frame of any image: one every few minutes may be enough.

The radiometer may be provided with an image-forming focuser assembly. There may be a defocuser adapted to defocus the detected image. The radiometer may have an observed radiation diverter adapted in use to divert the radiation which encounters the detectors from being radiation which has originated from the scene to being radiation that is not from the observed scene. The alternative radiation may be provided by a thermal source provided with the radiometer or separate from it. The radiometer may have thermal source holding or providing means. The thermal source may comprise a thermoelectric device, such as a Peltier device. There may be a temperature sensor adapted to measure the temperature of the thermal source and to provide indicative signals to the signal processor. A controller may control the current to a thermoelectric reference temperature device to achieve a desired reference temperature. The controller and the signal processor may be part of the same processor.

According to another aspect the invention comprises a method of improving the accuracy of an image or of output signals image produced by a radiometer comprising periodically performing an absolute calibration of the gain and offset voltage applicable to at least one radiation detection channel against a source of known temperature, the absolute calibration being performed with the radiometer in situ, without returning the device to the factory or the laboratory for calibration.

Thus, the absolute calibration can be performed by the user, conveniently, without the interruption and expense of returning the radiometer to a remote site for calibration.

The source may be a thermal source, which may comprise the sky and the method may comprise ensuring that radiation from the sky is received by the detection channel. The thermal source may comprise liquid nitrogen. The thermal source may comprise a thermoelectric device.

Preferably, the method comprises observing two different thermal source temperatures.

The method may comprise having a selector which selectively directs radiation from an observed scene onto the detector or radiation from the source of known temperature onto the detector.

According to another aspect the invention comprises a radiometer having at least one detection channel and a detector adapted to receive radiation acquired in use by the channel, a control processor, and an absolute reference temperature provider, the arrangement being such that the radiometer can be put, in use, in a calibration mode in which it resets the gain and/or offset associated with the, at least one, or each, channel by using signals derived from the reference temperature provider.

Preferably the radiometer has a selector adapted in use to select whether radiation reaches the detector from the observed scene or from the reference temperature provider, which may be a thermal source of known temperature. There may be a defocuser. There may be a quarter waveplate which can have its fast axis rotated by 45°.

According to another aspect the invention comprises a method of improving the performance of a radiometer having at least one detection channel comprising providing compensation for variations in temperature of the radiometer, or at least for variation in temperature of at least one component of the radiometer.

Preferably the method comprises providing an equivalence function which in the evaluation of an observed scene temperature observed by the channel compensates for the temperature of the radiometer, or said at least one component. The component may be (i) an amplifier which amplifies signals detected by a radiation-feed, or it may be (ii) a detector which detects signals, usually amplified signals, obtained from a radiation-feed, or it may be (iii) a radiation-feed, e.g. a horn or horn array.

The method may comprise having a concordance between detector output and evaluated scene temperature dependent upon the temperature of the radiometer or said component. The concordance may be a look-up table or an algorithm.

The method may comprise having a concordance between the input and output of any of (i), (ii), or (iii) dependent upon the temperature of the component (i), (ii), or (iii).

The method may comprise using a modified output of the component (iii) as the input to component (i), and/or modified output of component (iii) as the input for component (ii), the outputs being modified in accordance with the temperature-dependent performance of the components.

Alternatively or additionally, the evaluation of the temperature of a point in an observed scene may comprise taking the output of component (ii) and applying a modification which uses one of more of:

(a) the input-output characteristics of component (ii) with temperature; and/or
(b) the input-output characteristics of component (i) with temperature; and/or
(c) the input-output characteristics of component (iii) with temperature.

The input-output characteristics are preferably the gain and offset attributable to the components in the equation $$V_{detector} = \text{gain} \times T_{scene} + V_{offset}.$$

It is believed that the amplifier is the most temperature-sensitive component and the radiometer may compensate for changes in temperature of this and not the horn or detector. It is believed that the detector is the next most temperature-sensitive component and the radiometer may compensate for changes in temperature of that, or that and the amplifier, and not for changes in temperature of the horn.

The temperature dependency of the components could be predicted, but this is likely to be less desirable than measuring them. The method may comprise evaluating the temperature responsivity of the radiometer, or said at least one component, at one or more than one temperature in the operational range of temperatures for the radiometer.

In the above way, a free-standing temperature correction is made: once the machine has been calibrated/its processor set up with the appropriate temperature-dependent corrections, they are applied to the measured response to provide a modified response.

According to another aspect the invention comprises a radiometer having at least one detection channel having a gain and offset that are dependent upon the temperature of the radiometer and/or upon the temperature of at least one component of the radiometer, a signal processor, and a temperature sensor adapted to detect the temperature of the radiometer or of said component; the channel being adapted in use to provide signals indicative of the temperature in an observed scene to the signal processor, and the signal processor being adapted in use to produce evaluated scene temperature signals which are dependent upon both the channel signal and upon the temperature sensor signal.

The channel may have an amplifier and a temperature sensor may sense the temperature of the amplifier. The channel will have a detector and a temperature sensor may detect the temperature of the detector. The channel may have radiation-acquiring antenna, e.g. horn, and a temperature sensor may detect the temperature of that. The radiometer may have at least two or at least three temperature sensors providing signals to the signal processor indicative of the temperature of different components.

The signal processor may have a concordance look-up table or algorithm to produce the evaluated scene temperature signal, the concordance linking output detector voltage with evaluated scene temperature signal for different temperatures of the radiometer or of the or each component which has its temperature input to the signal processor.

According to another aspect the invention comprises a method of calibrating a radiometer comprising the steps of:
(i) providing a radiometer comprising a plurality of channels;
(ii) detecting a sample scan pattern for each of the channels;
(iii) overlapping at least two scan patterns;
(iv) sampling outputs of the channels at crossover points of the scan patterns;
(v) referencing gain and offset parameters at the overlap of the scan patterns.

The output of one of the channels may be compared with a predetermined reference value in order to obtain gain and offset parameters.

According to another aspect the invention comprises a method of calibrating a radiometer comprising the steps of:
(i) storing parameter values for a radiometer at a range of known temperatures;
(ii) determining the functional form of the variation of output of a component of this radiometer with a variation in temperature;
(iii) measuring the temperature of at least one component of the radiometer;
(iv) combining the one of said stored parameter values with the functional form of the component output at the measuring temperature in order to calculate a compensated radiometer output.

Defocus

According to another aspect the invention comprises an imaging radiometer having a focuser adapted in use to focus incident radiation onto a detector feed or a detector feed array of detector feed elements for normal imaging operation of the radiometer, and a defocuser adapted to defocus radiation from the scene that falls onto the detector feed or detector feed array so that each detector feed element experiences substantially the same radiation incident upon it, in use.

The defocusing element may be the same element as the focused. The focuser may have a focusing configuration and a defocusing configuration. Preferably the focusing element is moved angularly to change from the focusing to defocusing configurations. The focusing element may be moved angularly about 90° between the configurations. Preferably the focusing element comprises a linear polarizer. Preferably the focusing element focuses radiation with a first linear polarization onto the detector array, and not radiation with a polarization that is displaced by 90°.

The focusing element may comprise a dish of generally parallel wires. The focusing element may be disposed in front of the detector feed array, relative to a scene capturing aperture of the radiometer. A reflector may be provided and/or a polarization-changing element. The polarization changing element is preferably provided between the reflector and the focusing element. The polarization changing element may be a ¼ plate, such as a meanderline device.

Active Temperature Stabilization

According to another aspect the invention comprises a radiometer comprising a detector; a detector feed coupled to the detector; an amplifier receiving signals from the detector and providing amplified signals to a control processor; one or more temperature sensors sensing the temperature of one or more temperature-sensitive components of the radiometer for example one or more of the temperature of the radiometer as a whole, the detector, the amplifier, or the detector feed; and temperature control means; the temperature sensor providing temperature signals in use of the radiometer to the control processor indicative of the temperature of the one or more temperature sensitive components and the controller being adapted to control the temperature control means so as to maintain the temperature of the one or more temperature sensitive components substantially constant in use.

Thus excessive variations in temperature of components whose temperature fluctuation would affect the gain and/or offset of a channel, or between channels, are avoided, and so excessive temperature effects are avoided.

The temperature sensor and temperature control means provide a feedback system to enable the controller to maintain an appropriate operational temperature. The temperature control means may comprise thermoelectric, e.g. Peltier effect, components, the control processor controlling the electric current to the thermoelectric device in response to the temperature signals it receives.

Individual temperature sensitive elements/components may have their own temperature control means and/or temperature sensors.

Changing Tilt Angle

According to another aspect the invention comprises a conical scanning radiometer imager having a reflector inclined at a tilt angle to an axis about which the reflector is adapted to rotate in use, in which tilt angle adjustment means is provided adapted to alter the tilt angle of the reflector relative to the axis about which it rotates.

The tilt angle adjustment means may be operable whilst the reflector is rotating, and/or when the reflector is stationary.

A controller preferably provides signals, preferably electrical, to tilt angle adjustment means, which may comprise a motor, or a solenoid, a piezoelectric device, or an electromechanical transducer, to adjust the tilt angle in use. A tilt angle sensor may be provided adapted to provide signals indicative of the tilt angle to the controller. The tilt angle adjustment means may be adjustable to different positions to vary the spacing between the centres of cones/circles of scene space that optics of the radiometer projects, bit by bit in time, onto respective detector feed channels (to make the centres of the line of cones closer or further apart). The tilt angle may be adjustable to superimpose two, or all, cones.

Pixel Integration

According to another aspect the invention comprises a radiometer imager having a conical scan pattern in which radiation from a pixel in an observed scene space is directed onto a detector feed for a period of time when the optics of the scanning mechanism of the imager is appropriately aligned, electrical signals from a detector associated with the detector feed being correlated with a point in scene space to which they correspond by a control processor, and in which the integration time over which signals resulting from a particular point in space are allowed to integrate at the detector or control processor is controllable by the control processor, so as to provide an imager which has a variable pixel integration time.

Preferably the imager is adapted to control the integration time of some pixels to be different from other pixels in the image that is created. Preferably the at least one or some pixels on a particular conical scan can have different integration times, under the control of the control processor, to other pixels on the same conical scan. This may be achieved by varying an electronic time gating of received radiation so as to keep the gate open for longer, and/or by varying the speed of rotation of a reflector in the scanning optics. (e.g. a longer integration time could be achieved by varying the speed of rotation of a reflector in the scanning optics). The control processor may be adapted to determine whether the observed scene, or part of the scene, or an object in the scene, is moving faster than a predetermined speed, and may be adapted to alter the pixel integration time to increase it if movement above a threshold speed was not established.

If a scene changes too fast an increased integration time for a pixel will not give more data about that pixel in the scene at any particular time, but will instead "smear" changing data over time and produce an averaged value, instead of better resolution: it will not be looking at one pixel in the scene all of the time that the gate is open.

Pixel selection means may be provided to select which pixels in the observed scene means would have a modified integration time. The pixel selection means may be manually operable to select manually particular pixels or groups of pixels (e.g. the user could draw a line around an area of interest) to have their integration time modified, and/or the imager may have an automatic pixel selection routine adapted to identify pixels of a certain category or categories and alter their integration times.

Vary Pixel Calibration with Scan Angle

According to another aspect the invention comprises a method of calibrating a radiometer having a detector channel having a detector feed and a detector, and a scanner which scans an observed scene by directing different parts of the scene onto a detector feed of the detector channel at different times, with each notional pixel in an observed scene observed by the channel having an associated scan angle, the method comprising modifying the observed scene temperature detected by the detector by a calibration or compensation function which is dependant upon the scan angle of the notional pixel being observed.

Preferably the method comprises having a plurality of detector channels and modifying the respective detected scene temperatures by respective scan angle dependent calibration or modification functions. Each detector channel may have a different scan angle dependent modification or calibration function. Alternatively more than one, or all, channels may have a common scan angle dependent calibration or modification to the detected temperature for a scene pixel.

The calibration or modification function may comprise a modification to the gain and/or offset voltage of a channel for the particular pixel concerned.

The method may also comprise compensating for the temperature of the channel, or channel components, when evaluating the scene temperature for a pixel, preferably by modifying the gain and/or offset voltage with temperature of the device.

According to another aspect the invention comprises a scanning imaging radiometer having a scanner which is adapted to scan notional pixels in an observed scene onto a detector element of a detector channel, and a control processor that is adapted to receive signals from the detector element and is adapted to evaluate the scene temperature of the notional pixel from the output of the detector element and from a concordance or algorithm which compensates for the scan angle at which the pixel was evaluated.

Preferably the concordance or algorithm also compensate for the temperature of temperature sensitive components of the radiometer.

Software/Processor

According to another aspect the invention comprises a signal processor, or software, which when loaded into a radiometer provide a radiometer in accordance with any other apparatus aspect of the invention, or which when controlling the operation of a radiometer causes the method any method aspect of the invention to be performed.

The software may be provided on a data carrier, such as a disc.

The invention has most application to radiometric images, such as mm wave devices, possibly in the range of about 30 GHz to about 300 GHz, but possibly in the infra red range, or other wavelengths.

Embodiments of the invention will now be described by way of example only with reference to the accompanying drawings, of which:

FIG. 3A illustrates schematically a scanning real time imaging radiometer;

FIG. 3B illustrates in more detail the feed array of the radiometer of FIG. 3A;

FIG. 1 illustrates schematically the output voltage V of a detector of a radiometer against scene temperature and illustrates that when the radiometer is at temperature T, the detector has a relationship.

$$V = g_1 T_{1S} + V_{01} \text{ and } V = g_2 T_{2S} + V_{02}$$

When the device is at $T_2$ (where $T_{1S}$ is the scene temperature with the device at $T_1$, $g_1$ is the gain at $T_1$, and $V_{01}$ is an offset voltage with the device at $T_1$, and where $T_{2S}$ is the scene temperature with the device at $T_2$ $g_2$ is the gain at $T_2$ and $V_{02}$ is an offset voltage with the device for $T_2$).

Figure 1:
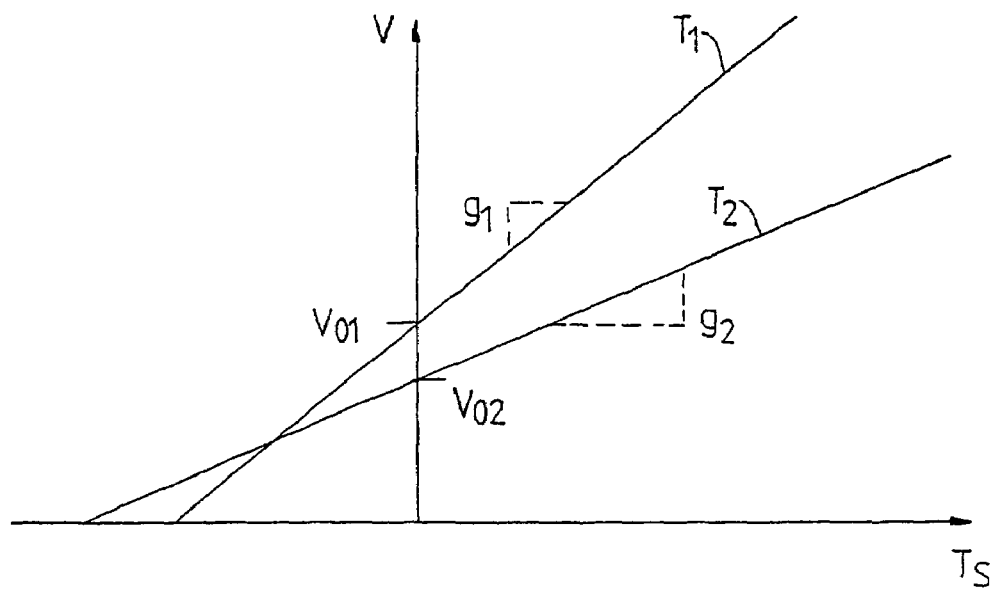
FIG. 1 shows a graph of detector output voltages against scene temperature, $T_S$, for radiometers having physical temperatures $T_1$ and $T_2$.

Thus the radiometer device has a performance that is temperature dependent. Moreover, the straight line graphs shown in FIG. 1 are simplistic: the receiver antenna may have a temperature dependent response, the amplifier will have a temperature dependent response, and the detector will have a temperature dependent response. Furthermore, the temperature of the radiometer device in use is unlikely to be exactly the same at all points in its structure; there will be thermal gradients.

Figure 2A:
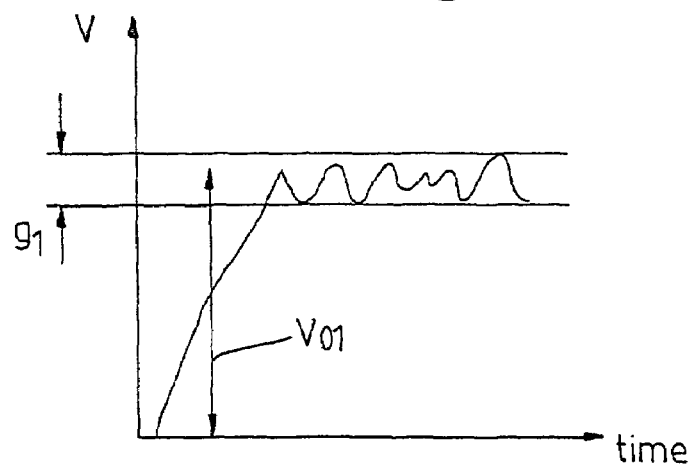
FIGS. 2A and 2B show graphs of detector output voltage against time for a radiometer at two different temperatures.
Figure 2B:
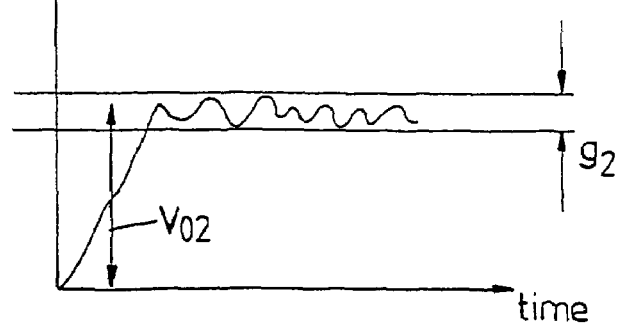

FIGS. 2A and 2B show the same effects. FIG. 2A is a graph of detection voltage vs time when a detection channel is observing a scene at a first point in time when the channel is at temperature $T_1$, and FIG. 2B is a graph of voltage vs time at a later point in time, when the channel is at temperature $T_2$. Also shown on FIGS. 2A and 2B are the offsets $V_{01}$ and $V_{02}$ are the voltage offsets at $T_1$ and $T_2$, and $g_1$ and $g_2$ are the gain at $T_1$ and $T_2$.

Figure 3C:
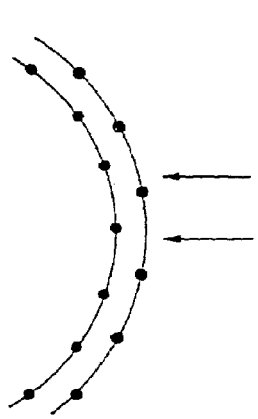
FIGS. 3C to 3G illustrate schematically non-straight detector arrays.
Figure 3D:
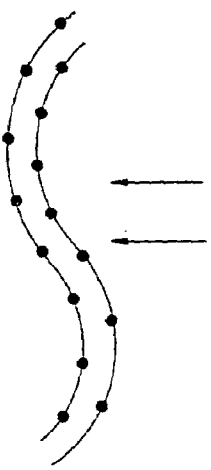
Figure 3E:
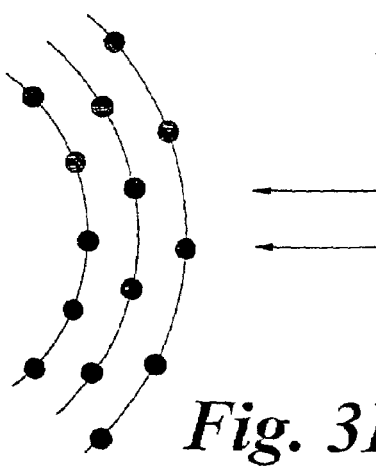

FIGS. 3A and 3B show a real time mm wave meanderline ¼λ plate based conical scanning radiometer 10. The real time passive scanning mm wave imaging radiometer 10 has a scanner 12, a focusing lens assembly 14, an antenna feed array 16, an amplifier 18, a detector 20, a microprocessor 22, a temperature sensor 24, and an image display 26.

The scanner 12 comprises a flat or slightly curved reflector plate 28 rotatably mounted about an axis 30, and inclined at an angle θ (say about 5°) to the normal to the axis 30. The focusing lens arrangement 14 comprises a quarter wave meanderline plate 32 provided between a focusing dish 36 and the reflector plate 28. The dish 36 comprises a polarizing reflector element (e.g. a wire grid).

Incident radiation 5a is linearly polarized by the grid/dish 36, which may have wires inclined at 45° to the vertical (say) so that the component of radiation with a plane of polarization 45° to the vertical (90° from the line of the wires in the grid) is transmitted through the grid 36. This linearly polarized radiation, referenced 5b, encounters the meanderline plate 32. The plate 32 has the fast and slow axes of the meanderlines inclined at 45° to the direction of the wires on the grid 36 (and hence to the polarization of the radiation 5b). Radiation 5c, emerging from the meanderline plate 32 is circularly polarized and is reflected from reflector plate 28 as radiation 5d, which is circularly polarized in the opposite sense to radiation 5c. When radiation 5d encounters the meanderline plate 32 it is converted back to linearly polarized radiation, radiation 5e, which has its plane of polarization rotated by 90° in comparison with radiation 5b. When radiation 5e encounters the focusing grid 36 it is reflected and focused onto the feed array 16.

An inclination of the plate 28 by θ causes the scanning of an angle of 4θ over the antenna.

Figure 5A:
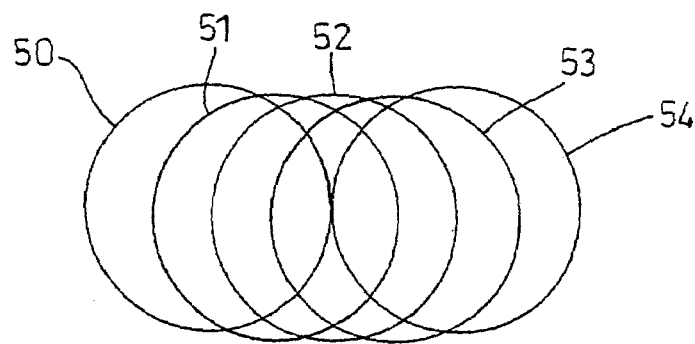
FIG. 5A illustrates schematically the overlap of fields of view of different channels of the array of FIG. 3 at different scanning positions of the scanner of the radiometer.

The feed array antenna 16 has two rows, rows 40 and 42, of detector elements, or horns 44 (best shown in FIG. 3B). Each horn comprises a detection channel. A single detector element 44 has traced out on it a circular scan pattern from the observed scene as the plate 28 rotates. As the detector elements of a row lie adjacent each other the image formed from each row is a series of displaced circles, as shown in FIG. 5A.

The output of each horn 44 (referenced 46) is fed to the amplifier 18. The amplifier 18 outputs to the detector 20 (e.g. a Schottky detector). The microprocessor 22 receives signals from the detector 20 and the temperature sensor 24 and processes these signals to produce an image 48 which is displayed on the display 26.

The detector array may comprise a feed horn, microwave waveguide, which may have a polarization direction, and monolithic microwave circuit (MMIC) receiver and detection circuit. The resolution of the radiometer is preferably diffraction—limited.

The above is a so-called conical scanning system. It is particularly compact.

Figure 3F:
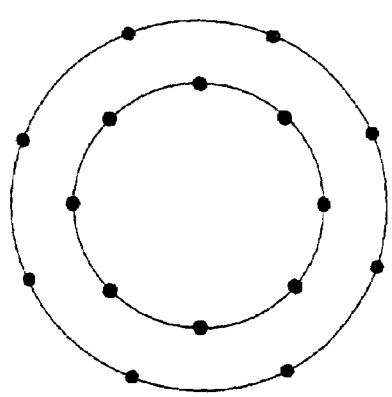
Figure 3G:
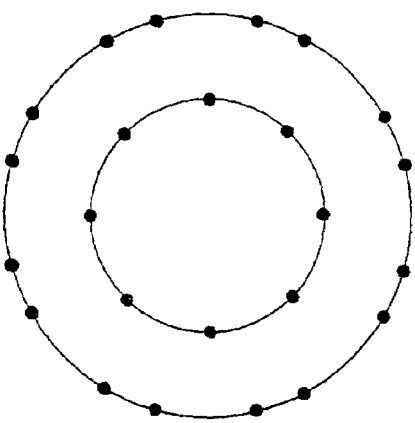

FIGS. 3C to 3F illustrate that the idea of having more offset feed elements of an array, so as to decrease their effective spacing when viewed along the direction of radiation incident upon the detector array, applies not only to straight, flat, arrays, but also to curved arrays. There can be more than two lines, or tiers, of feed elements. FIG. 3F shows a circular array modified to use the present invention (i.e. two circles, with offset feed elements). Offsetting feed elements, at different distances from the aperture of the device, allows more space for each feed element/allows a closer effective spacing.

Relative Calibration

FIG. 5A shows several detection paths 50 to 54 traced out on a scene being observed by the detector 20 (or more accurately shows the regions of a scene being observed that are detected by the detector due to the scanning motion of the plate 28). Circle 50 is the annular area of the scene projected onto or into a first channel (say channel 50' shown in FIG. 3). Circle 51 is the annular region of the scene detected by channel 51' as the scanner scans, circle 52 that is that detected by channel 52', and so on. If the paths 50 to 54 are close enough to each other a good image of the scene can be built up. It will be appreciated that by correlating the time of the detected signal with the position of the scanner each circle 50 to 54 is actually made of discrete measurements. This represented in FIG. 5B by what can be considered to be pixels 56,57,58.

Figure 5B:
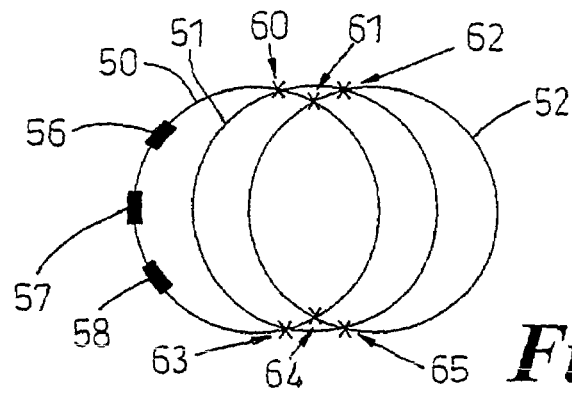
FIG. 5B illustrates schematically a technique for calibrating or compensating for temperature fluctuations in the radiometer of FIG. 3.

FIG. 5B also shows crossover points 60 to 65 where two circles intersect. Different circles are detected by different channels. At a crossover point two channels are detecting from the same point in space in the scene.

The adjacent (or not necessarily adjacent) channels detect from the same crossover point virtually simultaneously, or at least close enough in time for the temperature of the device not to have changed significantly, and close enough for the emitted radiation from that point in the scene not to have changed significantly (let us assume).

It will be appreciated that the different circles could be detected by the same channel, but at different times, if the field of view of the circular scan is changed a little between scans by the scanner. What is achieved is two intersecting scan circles (or paths, not necessarily circles) where the temperature of the device is constant (for one scan relative to the other) and the observed scene is constant (or effectively so).

For two scan paths detected using the same channel (let us say that circle 50 and circle 51 are traced out by the scanner 40 ms apart), then at time one:

$$V_{Detector} = Gain_{(Channel\ 1)}^{(temp\ of\ device)} \times T_{(Channel\ 1)}^{(of\ scene)} + V_{offset\ (Channel\ 1)}^{(temp\ of\ device)}$$

with the gain and offset being device-temperature dependent.

For the case where there are two channels then:

$$V_{Det\ Channel\ 1} = g_1(t) \times T_{scene} + V_{01}(t)$$

and $$V_{Det\ Channel\ 2} = g_2(t) \times T_{scene} + V_{02}(t)$$

There are two crossover points for each pair of adjacent (or relevant) channels, for example points 60 and 63. The temperature at the scene for these two points can be assumed to be different, so we have:

$$V_{Det\ Channel\ 1\ point\ A} = g_1(t) \times T_{scene\ A} + V_{01}(t) \quad \text{(equation a)}$$

$$V_{Det\ Channel\ 2\ point\ A} = g_2(t) \times T_{scene\ A} + V_{02}(t) \quad \text{(equation b)}$$

$$V_{Det\ Channel\ 1\ point\ B} = g_1(t) \times T_{scene\ B} + V_{01}(t) \quad \text{(equation c)}$$

$$V_{Det\ Channel\ 2\ point\ B} = g_2(t) \times T_{scene\ B} + V_{02}(t) \quad \text{(equation d)}$$

The scene temperature is measured or known in some way. For example, the main factory calibration:

$$V_{Detector} = gain \times T_{scene} + V_{offset}$$

has a non-temperature related value for gain and for $V_{offset}$. $V_{Detection}$ is known and so $T_{scene}$ can be evaluated. This is done for one of the channels, say channel 1, which serves as a main reference channel against which relative gain and offset of different channels is determined. Thus, values for $T_{scene\ A}$ and $T_{scene\ B}$ in equations (a) to (d) are known.

The four equations (a) to (d) now have four unknown variables and are solvable for those variables. Thus, new temperature-sensitive values for $g_1$ and $V_{01}$, and for $g_2$ and $V_{02}$ are established. They are more accurate relative to each other at that time in use than are the factory-set base line values for $g_1$ and $V_{01}$, and $g_2$ and $V_{02}$. This enhances image quality, and/or avoids the interruption and expense of returning the radiometer to a remote site for calibration.

Similarly, values for $g_3$, $V_{03}$ can be established, either by relative comparison between channel 1 and channel 3, or channel 2 and channel 3 (channel "already having been relative-calibrated relative to channel 1" vs new uncalibrated channel).

Similarly, in FIG. 5A channel 4 crosses channel 1 (and channels 2, 3, 5, etc), and its gain and offset can be relatively calibrated.

As a refinement, since the temperature at a crossover point is substantially to be the same the system can evaluate two temperatures for it using the two crossing channels (and using their factory set absolute calibration). It is possible to take the average of what the channels say is the scene temperature and use that as the $T_S$ in the processing.

It is believed that the temperature of the focal plane array antenna 16 is important in image quality, or more precisely that variations in temperature across the focal plane array antenna are the cause of image degradation and compensation/calibration for such temperature variations can improve image quality.

The relative calibration of the channels may take place periodically, say every second or so, or every ten seconds or so, with the device capturing images ever 40 ms or so, or alternatively the relative calibration algorithm could run more often, possibly in the construction of each image, or between every 1, 2, 3, 4, 5, 10, 20, 30, 40, or more images.

Figure 6:
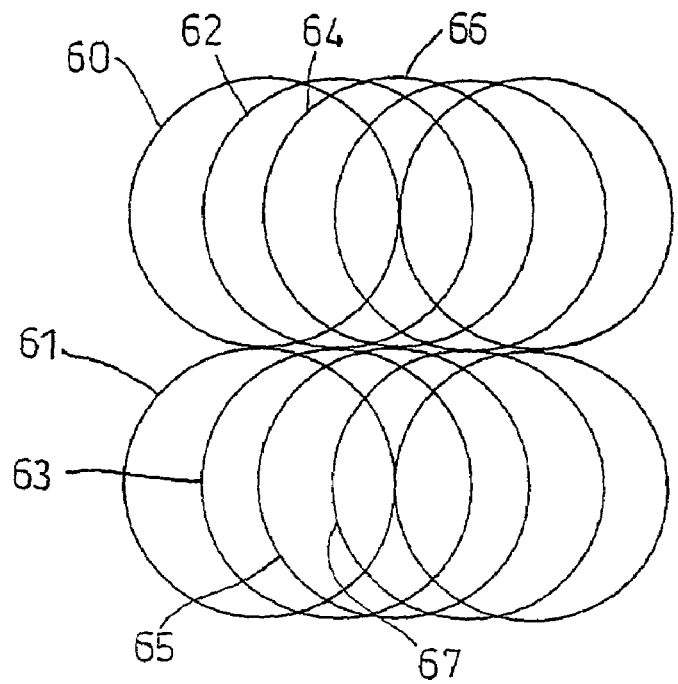
FIGS. 6 and 7 show other plots of scan cones over viewed scene.

FIG. 6 shows a conical scanning pattern over a larger angle. The scanner may scan cones 60, 61, 62, 63, 64, 65, 66 etc in turn. Alternatively, it could scan 60, 62, 61, 63, 64, 66, 65, 67 in turn, or any pattern where adjacent conical scans are scanned close enough together in time for the scene to be taken as not to have changed significantly.

Figure 7:
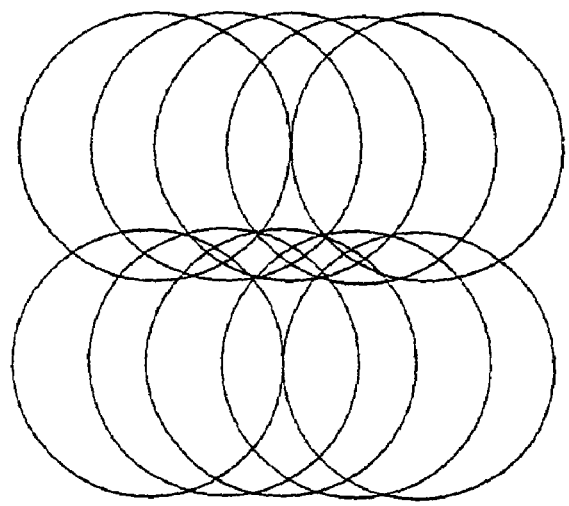
Figure 8:
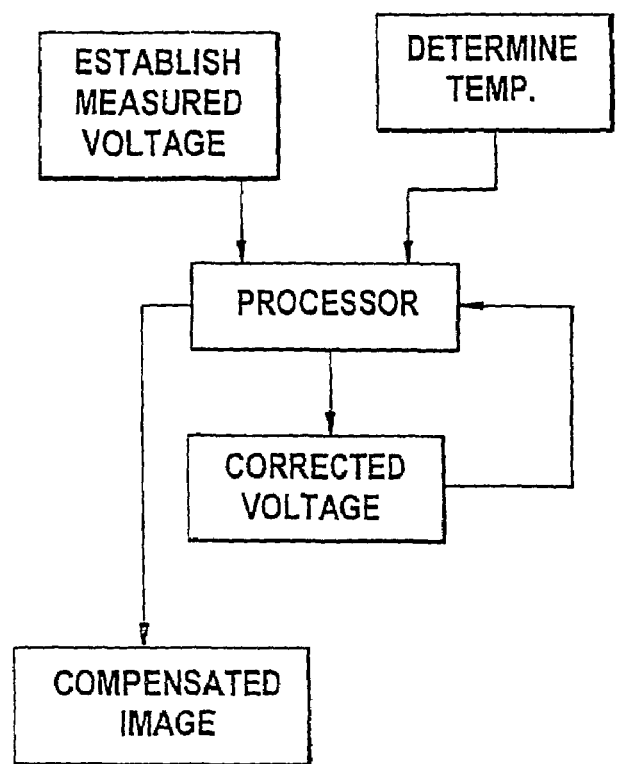
FIG. 8 illustrates a free standing calibration technique for a further embodiment of the invention.

FIG. 7 shows a conical scan pattern where the lower row of scan cones intersect the upper row, with each circle/cone of the lower row intersecting a circle/cone of the upper row at two crossover points. This allows relative calibration between the circles of the upper row and those of the lower row (as described earlier), and this enhances image quality.

It will also be noted that the image sampling/density of scan lines in the middle of the field of view is higher than at the edges. For a conical scanner with two adjacent linear arrays the imaging sampling is more than Nyquist at the top and bottom of the image (in both directions). In the centre of the image the sampling is close to Nyquist (or just under) in the horizontal direction and Nyquist in the vertical direction (defined by temporal sampling).

Sometimes a system may be able to over-sample and get more equations than there are unknown parameters, and the equations may not solve exactly (the parameters may not work out quite the same depending upon which groups of equations are solved to determine them). In such a circumstance the parameters (e.g. gain and offset for a particular channel) may be fitted to something (e.g. averaged, or least squares fitted). An over-determined problem (because of the scanning) can be used to advantage. It is possible to have more cross-checks to ensure solutions broadly match and are therefore reliable (and if one equation produces an anomalous result it could be omitted from the analysis. It can also be useful to have redundancy if one (or possibly more) of the channels fail.

It will be noted that the technique works best if the two temperatures have a large temperature difference, which will be if one is using the upper most and the other the lower most regions of the image, which will be for adjacent channel overlap. To get the best of both worlds it might be good to do the correction with three channels at a time, one central channel and the two adjacent ones. The chance of two adjacent channels failing is much less than one channel failing.

It will be appreciated that the conical scanning architecture of the real time imager described lends itself admirably to techniques which can improve the relative calibration. This is because many regions in the image are measured several times by different radiometer channels. The assumption that the temperature in the image does not change between measurements is generally valid, and if not, the fact can be known from examination of the raw uncalibrated data from the radiometers (and the device knows not to use that technique at that moment—indeed the device may have this check as part of its relative calibration operation). This technique can also be implemented on alternative imager architectures such as the pattern from a circular array of feeds.

As will be appreciated from the foregoing, a particular channel, a master channel, would be chosen as having a fixed calibration gain and offset. The neighbouring channel would then have its gain and offset modified so that the temperature measured at the points where the channels cross are the same. For neighbouring channels there are two cross-over points and if the scene temperatures at these two points are different (which is generally the case) the corrected gain and offset for the channel can be calculated. If by chance the temperatures at the two points are very similar (a fact which can be established by examining the uncorrected calibrated data) it should be arranged for the image to view a scene in which the radiation temperature across the scene varies by a large mount. For an outdoor operation, such a direction would be that towards the horizon (sky and land have different temperatures). In such a fashion this calibration method would move from one channel to the next making the relative calibration such a technique greatly improves image quality.

An extension of the above technique is that different cross-over points could be used not just the ones on the adjacent channels. This could be used to complement the above method, to improve still further image quality. Furthermore, the angle of the tilt on the imager spinning disk could be changed to allow the imager to change its field-of-view and view different regions of a scene or sources for calibration purposes.

Other possibilities for relative calibration are making gain and offset corrections on neighbouring channels using a 360° conical scan averaged temperature or AC components of the temperature. The assumption being here that the averaged temperatures or the AC component of the temperatures on two adjacent channels are the same.

Typical frequencies for radiation detected by the radiometer may be 35 GHz, 94 GHz, 140 GHz, 220 GHz; these are the atmospheric window bands for mm waves.

The radiometer uses monolithic microwave integrated circuits (MMICs) and has a small volume.

Figure 4:
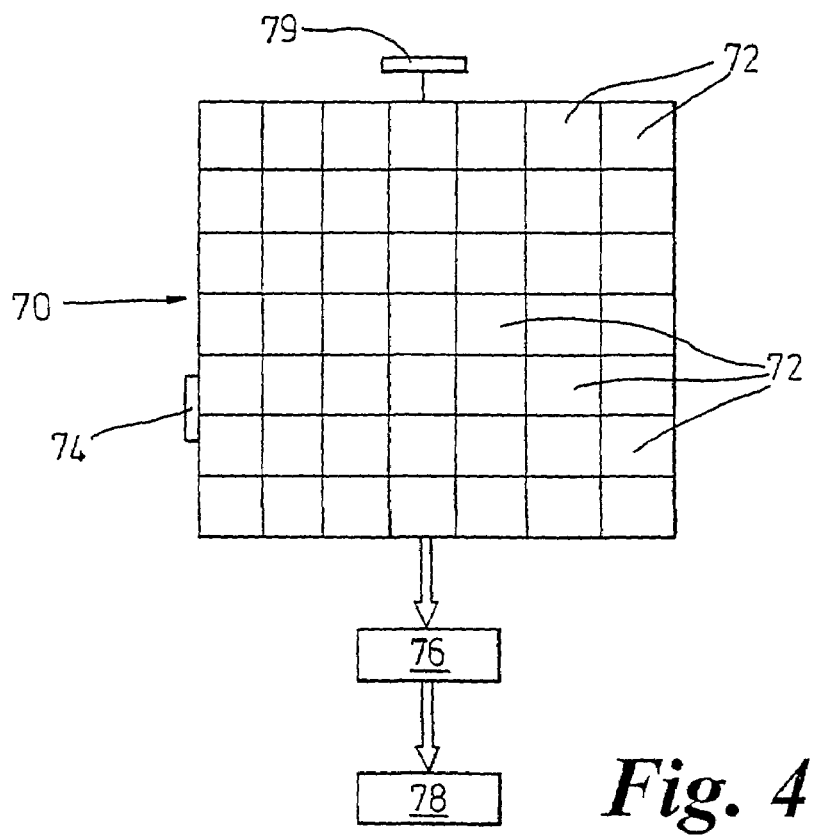
FIG. 4 illustrates schematically a staring array imaging radiometer.

FIG. 4 shows a staring antenna 70 having a grid of antenna horns 72, a temperature detector 74 detecting the temperature of the array, an amplifier 76, and a detector 78.

Even though FIG. 4 shows a staring array it still performs a scan for calibration purposes. A microscan could be performed periodically to cause more than one channel to see substantially the same point in the scene at substantially the same time (but not quite the same time). An optical component, or a whole imager, is caused in the microscan calibration operation to move slightly (e.g. so that one channel measures the vertical and/or horizontal nearest neighbour pixels, as well as its own pixel). This "dither" creates the same multiple channels looking at the same temperature (same point at very close times) effect and so the staring array can perform relative calibration between channels. It can, of course, have absolute calibration performed on it.

In order to get two physically separate parts of the scene observed by the same channel in a staring array (and hence two widely different temperatures observed) it may be necessary to move the field of view of the radiometer, or do something else to achieve that.

If it is not possible to observe two different temperatures with both channels being relatively calibrated, it may be necessary to assure that only one of the gain and offset varies with temperature and that the other is fixed, and calibrate using the one that is assumed to vary. Alternatively, single point calibration may be used. These points apply to scanning radiometers as well.

Free Standing Calibration

The use of crossover points in different scans from different channels to perform a relative calibration between channels assists calibrating one channel relative to another, but it does not assist in setting the absolute calibration of the "master" channel (or indeed absolute calibration of any channel).

It is envisaged that the device 10 may return to a laboratory or factory periodically (e.g. every three or four months) for resetting of the absolute calibration of the channels.

In addition to this, or possibly instead of this, the device may be capable of adjusting its absolute calibration in the field.

The device 10 is tested in a factory or laboratory prior to release to a customer with the device at a large number of temperatures and a performance look-up table or algorithm is constructed correlating device temperature with gain and offset voltage. Thus, for each device temperature a corresponding value for gain and offset voltage is established by the device in use. This is typically a look-up table or algorithm in the processor 22.

This technique of correcting the device gain and offset for device temperature can be applied to devices which have relative channel to channel calibration, and to those that do not.

It will be appreciated that controlling the temperature of the whole device to be at a known, same, temperature and establishing the device gain and offset for the device at that temperature is a little simplistic (but better than not allowing for device temperature changes in the field). In practice in the field, with the device in use, there are likely to be temperature gradients over the device: one channel may be at a different temperature to a remote channel; the amplifier may be at a different temperature to the antenna, the detector may be at a further different temperature.

It is believed that the main temperature sensitive components are the rf amplifier (with perhaps about ¾ of the temperature dependent effect from that) and the detector (with perhaps ¼ of the temperature dependent effect from that). In practice it is possible for the amplifier and the detector to be close together so that only one temperature sensor is needed.

Also possible, but perhaps more complicated to implement, is an arrangement where temperature detectors for more than one place in the device are provided. FIG. 3 shows only one temperature sensor 24, but the amplifier and/or detector could have either a single temperature sensor or their own temperature sensor(s). Groups of horns, or each horn, could possibly have an associated temperature detector. The microprocessor 22 would then receive a plurality of temperature signals from a plurality of regions/parts of the device.

The microprocessor 22 could have a matrix/look-up table relating the temperature sensor temperature to a gain and offset, or relating different and all combinations of sensor temperatures to an associated overall device gain and offset for each channel. This would, of course, need to be established in advance of use of the device by operating the device at these combinations of temperatures to observe known scene temperatures (at least 2) and working out the appropriate gain and offset to load into the look-up table (or to create an appropriate algorithm).

An alternative approach is to determine the effect or gain and offset of changes in temperature of one or more individual components of the device (or groups of components) and to generate the overall gain and offset from those. For example each channel (or a group of adjacent channels) may be tested in the factory to determine how their output signal ($S_{channel}$) varies with temperature of the channel ($T_c$) and a function $S_c(T_c)$ created (either look-up or algorithm-based).

How the amplifier performance ($S_A$) varies with amplifier temperature ($T_A$) can be determined to create a function $S_A(T_A)$. The detector could be evaluated at different detector temperatures to determine how the detector voltage ($V_D$) varies as a function of temperature of the detector ($T_D$) to created $V_D(T_D)$. The output voltage from the detector is then predicted to be related to:

$$V_{output} \alpha S_C(T_C) \times S_A(T_A) \times V_D(T_D)$$

and a compensated output voltage ($V_{calibrated}$) can be obtained:

$$V_{calibrated} = V_{output} f(T_C) f(T_A) f(T_D).$$

Expressed another way, the gain and offset voltage can be:

$$\text{gain}_{(Channel)} = g_{absolute\ calibration} \times f(T_C) f(T_A) f(T_D) \text{ and}$$

$$V_{offset(channel)} = V_{offset(absolute\ calibration)} \times f(T_C) f(T_A) f(T_D).$$

The $f(T_C)$, $f(T_A)$ and $f(T_D)$ are evaluated/created by operating the device at a range of temperatures for the parameters $T_C$, $T_A$, $T_D$, using reference temperature sources. It may be possible to predict one or more of $f(T_C)$, $f(T_A)$ or $f(T_D)$ without physically testing the apparatus to create/determine them.

Just as the embodiment of FIG. 1 may have several temperature sensors, so may the embodiment of FIG. 4 (again, possibly a temperature sensor for the amplifier and/or detector, and one for each channel, or each group of channels).

Antenna Design:

A further feature of the embodiment of FIG. 3, and one that is applicable to other mm imaging radiometers, especially real time imaging, is the design of its antenna. A conventional antenna has a single row of horns and is a certain length (in order to get the desired size of scene image scanned).

It has been appreciated that the current spacing of horns/channels in a single row of horns is not sufficient to achieve Nyquist sampling in the image plane, thereby introducing the possibility of aliasing in the constructed image. the channels are namely are too far apart. Yet they have to be a certain size to capture the radiation of desired wavelength.

The solution to this problem is to have a second (or further) row of horns/channels in substantially the same plane as the first row, but with the horns of the second row offset or staggered in the elongate direction of the row. This then essentially means that the spacing of the horns in the elongate direction is halved (for two rows). With reference to FIG. 3, the centre of horns 50' and 51' are a distance D apart, but the distance apart in the elongate direction of the antenna between horn 50 of row 40 and horn 53' of row 42 is D/2. This enables us to get the horns closer together, effectively, and allows us to approach a Nyquist sampling distance, thereby avoiding aliasing in the constructed image. We may use three, four, or more rows of channels/horns to reduce their effective separation in the direction transverse to the scanning direction (the scanner 14 scans the observed scene over the antenna 16 in a direction perpendicular to the elongate direction of the antenna).

The offset of the detector channels does not have to be half period, but that achieves the best resolution when there are only two rows. For three rows the offset could be ⅓ period (1/n period for n rows).

Figure 9:
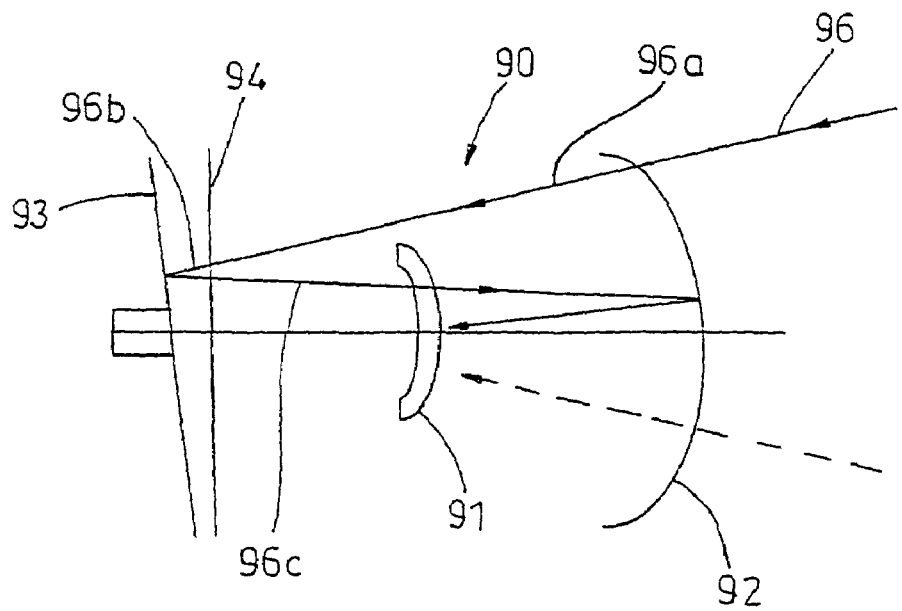
FIG. 9 illustrates a real-time imaging conical scan quarter wave plate radiometer in accordance with the invention.

FIG. 9 shows another real time imaging scanning radiometer 90 in a quarter wave plate, e.g. meanderline, scanner. The radiometer 90 has a focal plane detector array 91, a polarization-sensitive selectively transmissive or reflective grid or dish 92, referred to as a focusing reflector (this could be a grid of parallel wires), an angled, or tilted, rotating reflector plate or disc 93, and a quarter wave plate 94. A meanderline plate is a known device which is essentially a quarter wave plate and which has a series of meandering lines with repeating components in orthogonal directions which have the effect, dependant upon the plane of polarization of incident radiation and the orientation of the meanderline plate relative to it, changing the polarization from linear to circular as it passes through the meanderline plate 94. The quarter wave plate 94 is for normal imaging operation arranged with its fast axis at 45° to the plane of polarization of the radiation that reaches it from the gird 92 (45° to the plane of polarization of the radiation 96a shown in FIG. 9). The quarter wave plate 94 and the spinning disk 93 act together as a twist reflector, enabling element 92 to focus incoming radiation 96 whilst providing a conical scan of the image.

In normal imaging use, shown in FIG. 9, thermal radiation 96 from an observed scene enters the radiometer and passes through the grid of parallel wires that make up the reflector 92 if the radiation is polarized with its electric field vector perpendicular to the direction of the wires. Similarly, radiation which is polarized with its electric field vector parallel direction of the wires is reflected.

The polarized component of the incoming radiation 96 is 96a. The linearly polarized radiation 96a passes through the quarter waveplate 94 and is transformed to the right hand circular polarization (RHC) radiation 96b. This only happens when the fast (or slow) axis of the meanderline plate, or quarter wave, is inclined at 45° to the plane of polarization of the radiation 96a. (as mentioned earlier). The RHC radiation then reflects off the plate 93 and becomes left hand circular polarization radiation (LHC) and, passes back through the quarter wave plate 94 and is converted from LHC radiation to linearly polarized radiation 96c, but with its plane of polarization at 90° to that of radiation 96a. This is to say radiation 96c is now orthogonally polarized relative to radiation 96a, and to the dish 92.

The radiation 96c then reflects off curved reflector dish 92 (since its plane of polarization is now at 90° to what it was when it came in originally) and is focused onto the focal plane detector array 91. This is the normal imaging operation. It will be recalled that the receiver feed horns of the array 91 have a polarization plane, which shall be assumed to be parallel to that of the radiation receiving it, after the optics discussed above.

The focal plane array 91 could be a linear, or curved, or an annular array of detector feed elements/radiometer receivers.

Figure 9A:
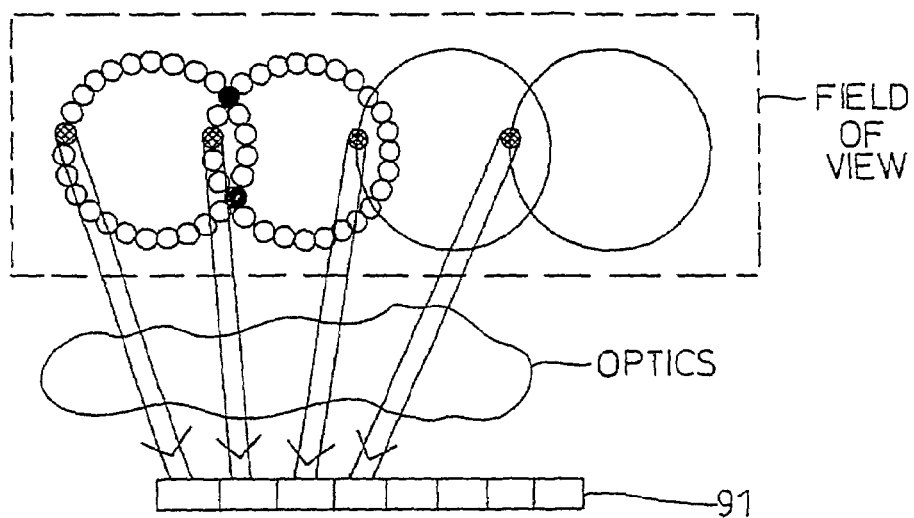
FIG. 9a illustrates schematically the scanning of different regions of the observed scene into different detector feeds of the detector feed array of the radiometer of FIG. 9.
Figure 9B:
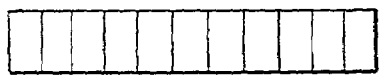
FIGS. 9b and 9c show a linear array of feed elements and an associated sensitivity pattern.
Figure 9C:
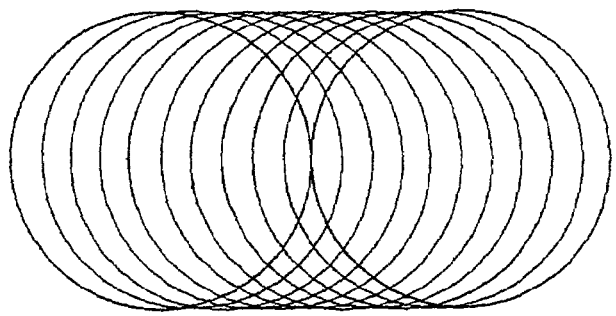

FIG. 9b shows a linear array of receiver feed elements, or channels, in an image plane. FIG. 9c shows that the array of FIG. 9b gives linearly displaced circles of sensitivity in the imager field of view.

Figure 9D:
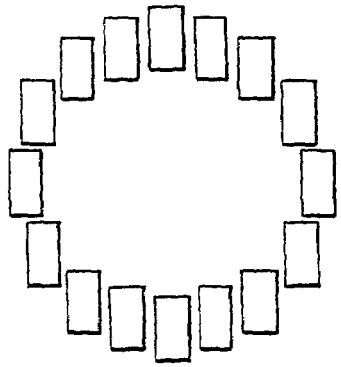
FIGS. 9d and 9e show an annular array of feed elements and an associated sensitivity pattern.
Figure 9E:
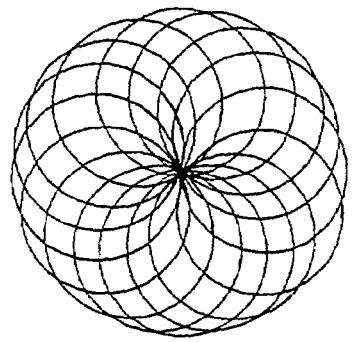

FIG. 9d shows an annular array of receiver feed elements, or channels in the focal plane, which gives rise to an annularly displaced set of circles of sensitivity in the imager field of view, shown in FIG. 9e. The centres of the circles of sensitivity of the imager field of view shown in FIGS. 9c and 9e are placed either in a line or circle, depending if they are associated with the linear array of FIG. 9b or the annular array of FIG. 9c.

The radiometer also has a defocused mode. If the dish reflector 92 is rotated by 90° in comparison with its orientation in the discussion above then the radiation entering the detector array 91 is unfocused, and so will be substantially the same for all channels in the detector horn array 91. This is because in this configuration the polarization to which the detector horn array is sensitive radiation can pass directly through the grid 92 without passing through any of the scanning optics (components 94 and 93) and hence without being focused.

Figure 10A:
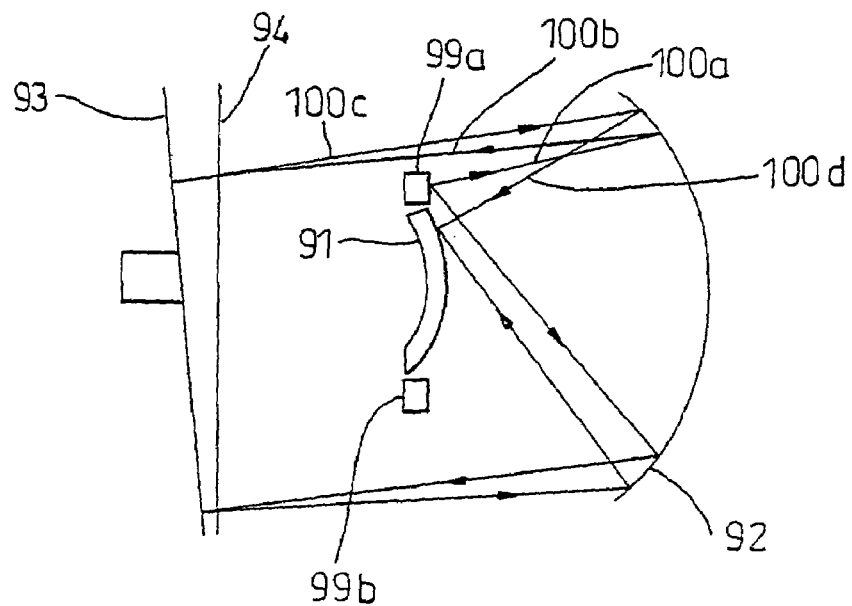
FIGS. 10a and 10b show the radiometer of FIG. 9 configured for calibration.

Referring to FIG. 10*a*, a thermal radiation source 99*a*, a hot source, and another radiation thermal source 99*b*, a cold source, are placed diametrically opposite each other at the periphery of the detector array 91. These sources can be used for the purposes of calibration. As will be described later, rotation of quarter waveplate 94 by 45° (from the normal imaging mode) causes radiation from these sources to enter the channels of the array 91. The fast (or slow) axis of the quarter waveplate is now parallel to the direction of the wires in grid 92. In this calibration configuration, as the disk 93 rotates an annular image of the detector array 91 is traced out in the focal plane. This means each detector channel gets to measure alternately the emission from the hot and cold calibration sources.

Looking at FIG. 10*a* radiation 100*a* is emitted by a source 99*a* or 99*b*. Linearly polarized radiation 100*b* is reflected back from dish 92 (and orthogonally polarized radiation passes through the dish), the radiation 100*b* has its plane of polarization parallel to one of the fast or slow axes of the quarter wave plate meanderline 94 and passes through it, still linearly polarized, is reflected from rotating disc 93 as radiation 100*c*, (still linearly polarized), passes back through the meanderline plate 94, re-encounters the dish 92, and is reflected and focused by the dish 92 (radiation 100*d*) to a point 102 at the periphery of the array 91. It will be noted from FIG. 10*a* that the radiation 100*a* reflected from the dish 92 is a nearly parallel beam (because the source 99*a* or 99*b* is nearly at the focal point of the dish 92), and that the thermal emissions from quite a large angular range are collected by the dish 92, as the disk 93 rotates. It will also be appreciated that the effect of arrangement of FIG. 10*a* is that the outermost two (or perhaps more) channels 103*a* and 103*b* of the array see a known temperature, the thermal source temperature, and that this can be used for absolute calibration of those channels, which may be used as a reference channel, or channels, for the relative calibration of other channels.

The relevant factor in operating the radiometer in a defocused mode is the relative orientation of the wires in the grid polarizer 92 with respect to the plane of polarization to which the array detectors are sensitive. Rotating the grid polarizer 92 by 90° (from its normal mode of imager mode of operation) changes the system from one that focuses to one that receives unfocussed radiation.

The rotation of the tilted disc 93 causes the point adjacent the focal plane array that is focused onto the array 91 to trace out the annulus 91*a* of varying diameters in the focal plane.

The thermal source 98 may initially be a hot or a cold load placed adjacent to the array 91, and in a second calibration operation it is the other of the hot or cold loads. A single thermal source may be provided, possibly of changeable temperatures, or two different temperature sources, as shown in FIGS. 10*a* and *b*.

The thermal load could be a true thermal load, emission of thermal radiation being from thermal absorbers at the two different temperatures. The temperature of the thermal source 99*a* or 99*b* could be liquid nitrogen temperature, or another defined temperature. They could range to a few hundred Kelvin. It is best if the temperature of the source 98 is known. There may be a temperature sensor e.g. thermistor to measure the temperature of the thermal source 99*a* or 99*b*, or it may be known in some other way (e.g. the boiling point of liquid nitrogen at atmospheric pressure is known).

The thermal source may be manually mountable and/or demountable, or it may comprise a receptacle provided adjacent the focal plane array capable of holding a source of hot or cold loads.

The hot and cold loads could alternatively be produced by thermoelectric e.g. solid state sources, such as Peltier effect devices.

It will be appreciated that being able to present a source temperature to more than one channel in the array 91 enables relative channel calibration as previously discussed (whether that be by defocusing and using the scene as a constant temperature, or whether that be using the source 98 as the same constant temperature).

In addition, if the absolute temperature of the source 99 is known with sufficient accuracy (e.g. to 1K or so) then that knowledge can be used to perform an absolute calibration of a channel, and each channel of the whole system. For example, the radiometer 90 system could have an absolute calibration with a single source 99 of known temperature, or with two known (but different) source temperatures, periodically, say daily, weekly, monthly. The system could then perform relative calibration much more frequently (e.g. of the order of every few seconds, or as discussed earlier). The source 99 or sources 99 are in the embodiment of FIG. 9 presented to each channel in the system.

The scanner configuration shown in FIGS. 9 and 10 has low optics losses, in the example about 0.5 dB. This compares well with the losses of the scanner in UK Patent Application No. 9707654.1 which has losses of around 4 dB. Thus, the system of FIGS. 9 and 10 is at least twice as sensitive as that of GB 9707654.1.

Figure 10B:
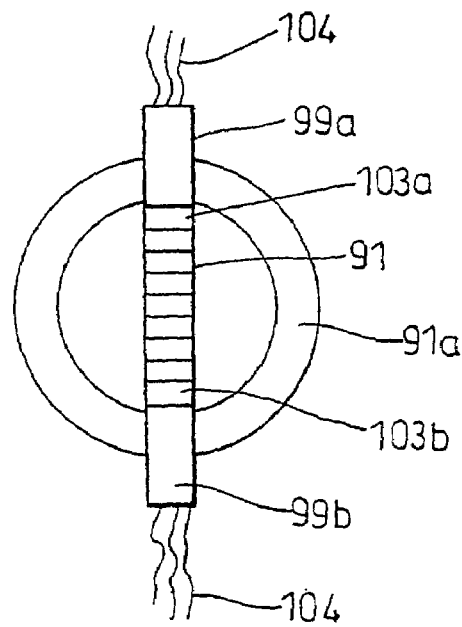

It will be noted that in the arrangement shown in FIG. 10*b* the channels of the detector array need electronic communication to the processor or controller that processes their signals, and that this is provided by electric cables 104 which extend out along a diameter of the device. Thus the cables obscure part of the radiation incident upon the device. The addition of the hot and cold sources 99*a* and 99*b* on the same line as the exit areas of the array's cables does not obscure substantially any more of the operational area of the imager than is already obscured by the cables 104. Thus introducing the source 99 does not significantly reduce the optical performance of the device.

A further advance of this system is that the desired radiation bandwidth is not restricted by the ferrite as in the scanner of GB 9707654.1, which is a ferrite-based scanner. This means the bandwidth around 30 GHz can be from 26 GHz to 40 GHz. This is a bandwidth of three times that of the scanner of GB 9707654.1, which is only 5 GHz. This offers a root three, ~1.7, factor in improvement in the sensitivity. Furthermore, this system could be used at the 94 GHz window. It could also be used at the higher frequencies of 140 GHz, 220 GHz and beyond where it may be difficult to find a suitable ferrite. It has a much more flexible operational range of frequencies.

It will also be appreciated that the angular movement of the reflector 92 and/or the meanderline plate 94 could be effected manually, or the radiometer may have motors to achieve this, under control of a controller. The user may be able to initiate a calibration operation by inputting a command.

Figure 11:
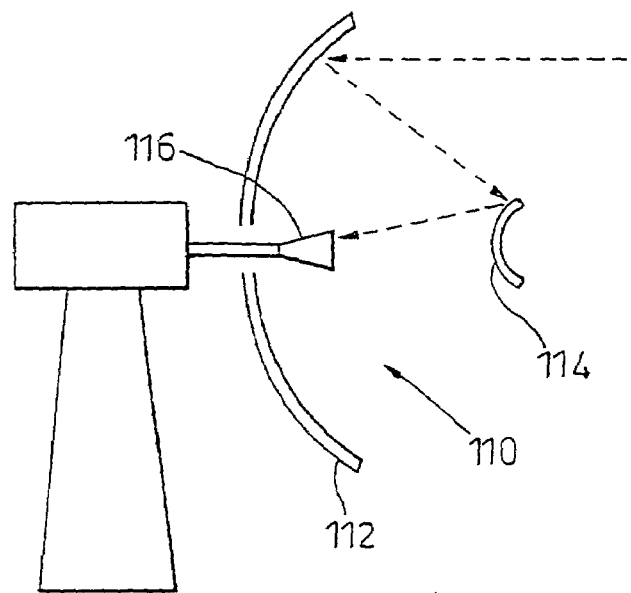
FIGS. 11 to 13 show another scanning radiometer.

FIG. 11 shows another conical imaging scanner 110 having a Cassegrain configuration. A primary reflector 112 reflects and focuses radiation onto a subreflector 114 which reflects and assists in focusing the radiation into a horn 116, or a focal plan horn array (similar to that shown in FIG. 3).

When the horn is a rectangular waveguide horn, the apparatus is inherently linearly polarized because of the rectangular horn and waveguide.

It is possible to adjust the polametric sensitivity of the system by placing a linear polarizer in the path of the radiation—for example in front of the horn 116, or in front of the whole imaging scanner (possibly as part of the scanner). The linear polarizer could be half-wave plate. If it is placed before the horn it can be physically small, whereas if it is before the radiation reaches the primary reflector 112 it needs to be bigger.

Figure 12:
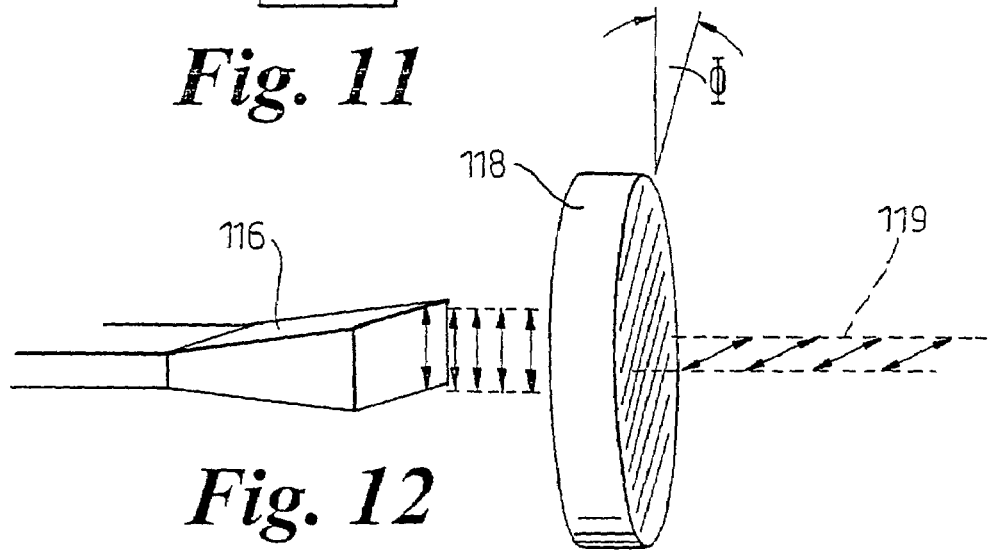

FIG. 12 shows a half-wave plate 118. This routes the plane of polarization of incoming linearly polarized radiation 119 through an angle that is twice the angle between the rectangular horn E direction and the optical axis of half-wave plate. Thus, if $\phi$ is 45° the half-wave plate 118 rotates the plane of polarization by 90°. FIG. 12 shows horn 116 having a vertical polarization and incoming horizontally polarized radiation 119.

Figure 13:
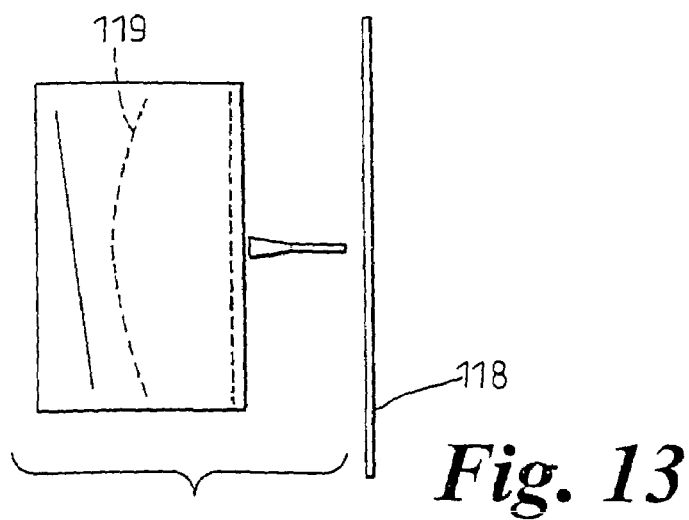

Thus by rotating the half-wave plate 118 (whether that be disposed immediately before the horn or elsewhere) it is possible to alter the radiation entering the horn. In the case of FIG. 12 the plate 118 can effectively switch off external radiation entering the wave-guide associated with the horn (because the horn has a place of polarization and the plate 118 can be orthogonally crossed). In the case of FIG. 13, angular displacement of the plate can cause the focusing effect of the focusing dish 119 to be lost, effectively defocusing the device.

Figure 14A:
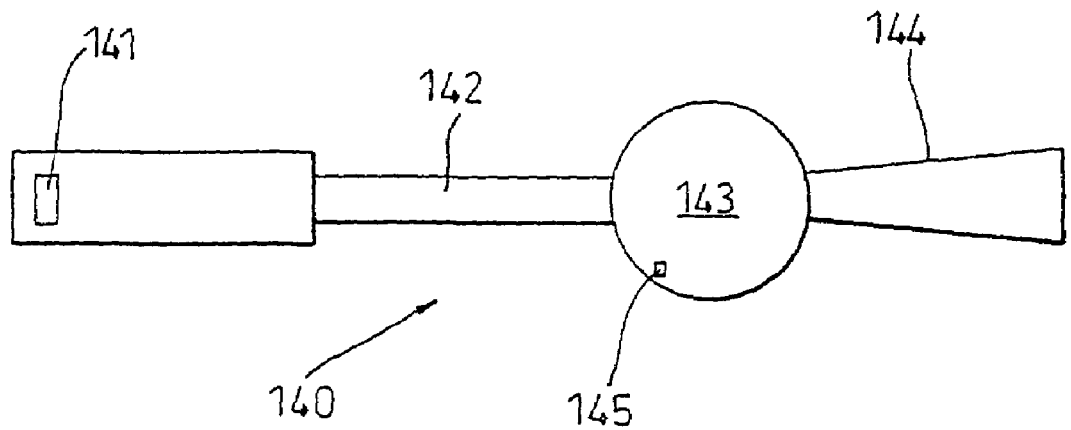
FIG. 14a shows another radiometer.

FIG. 14a shows an arrangement for absolute calibration in which a radiometer 140 has a detector 141, a cavity 142, a switch 143, and an antenna 144. When the switch is in an open position radiation from the outside world propagates directly through the cavity 142 and into the radiometer body to be detected by the detector 141. This is the normal imaging arrangement. The radiometer also has a calibration configuration or mode in which the switch 143 is closed and the radiation that enters the radiometer body is that from the cavity. As the temperature of the cavity can be measured (the machine has a temperature sensor 145) a known thermal temperature profile of radiation will be incident upon the detector.

The architecture of this system may at first glance appear similar to that of the Dicke radiometer which was a switch to compensate for changes in noise temperature, but the present system has a slower switch to calibrate for variation in radiometer device temperature (not noise temperature), to correct the gain and/or offset voltage. The cavity 142 could be a length of low loss waveguide. The switch 143 can be a pin diode.

The radiometer may have part of its temperature stabilized by insulation and/or a heating/cooling system. For example, the front end (antenna 144, switch 143, and waveguide cavity 142) may be temperature-stabilized.

As an alternative to a true thermal alternative source signal (e.g. from the cavity 143), it is possible to provide other reference temperature signals, selectively using an appropriate switch. Such alternative source signals could include known magnitude signals (e.g. from an RF source). Alternative source signals at two different levels would usually be provided at different times, to enable both gain and offset to be evaluated. A single level could be used if the gain and offset can be limited to a single parameter, e.g. temperature.

Active Temperature Stabilization

An alternative approach to compensating for temperature changes in use within the imager device is not to allow the temperature of the device to change (or at least not to allow the temperature of one or more critical components to change). Heating/cooling temperature control equipment (e.g. Peltier effect thermoelectric devices) can be used to maintain the temperature of some or several or all temperature sensitive components of the imager.

The design of the imager can be such as to have temperature sensitive components associated with thermal reservoirs of high thermal mass so that their temperature does not change rapidly. For example, the detector or detector array can be mounted on a large metal block.

Scanning vs Staring

It is preferred to use a scanning imager rather than a staring array because a staring array is more expensive. If the cost difference reduces, or is worth paying, a staring array may be preferred. With a staring array there is the advantage that one can look at pixels for longer and this makes the noise smaller, and that can be advantageous. However, there are some disadvantages to staring arrays and these are that one cannot get Nyquist sampling unless microscan is performed, sampling in-between the pixels. Furthermore, once you start scanning then you can also get relative calibration. So in actual fact scanning is not so bad, and in spite of the fact the noise is more as you are not looking at each pixel for very long it is good enough for many applications.

A system with a set of gain an offset coefficients for each point in the scan is envisaged. Again these could be established by testing the device in-factory.

De-Focusing

A further technique applicable to the embodiments previously described and also to other devices, is that of de-focusing the observed scene so as to homogenize the signal received by each channel.

It can be desirable to do this for a number of reasons. One reason is when performing an absolute calibration of the channels, using a hot and a cold source of known radiation temperatures, a better calibration of multiple channels is achieved if the channels receive a signal of the same strength. By de-focusing the received radiation differences in received radiation strength between different channels can be minimized or avoided during the absolute calibration process.

De-focusing the radiation received by channels also has a purpose in relative calibration. As part of the relative calibration technique discussed a comparison of two channels at their crossover points has been discussed because the channels see the same temperature at that point. De-focusing also means that each channel sees substantially the same temperature. Thus de-focusing the channels and then establishing the relative calibration between channels has advantages. It also allows for relative calibration of systems which do not have crossover points (e.g. staring arrays). De-focusing to achieve the same scene temperature for each channel for relative calibration may be performed instead of, or as well as, crossover point comparison.

The image is, of course, re-focused for the image data collection process.

In the passive real time mm wavelength imagers with which we are primarily concerned, there is a particularly attractive way of achieving a de-focus. The radiation received is typically polarized, and this allows the use of polarization effects to change the apparatus from focusing to de-focusing.

For example, in the ferrite conical scanner embodiment of FIG. 3 if the polarizing grid 32 is rotated from its focusing position shown in FIG. 3 by 90° so that instead of reflecting beam 5d it transmits it, the scanner effectively becomes simply a reflector instead of a focusing reflector.

It is mechanically simple to rotate by 90° a planar member, for example the polarizing grid 32 mounted at its periphery to a supporting dish.

Alternatively or additionally, the grid 36 could be rotated to achieve de-focus. This may be more difficult mechanically, but still achievable. Both grid 32 and grid 36 could be rotated to achieve the same effect (e.g. 45° each). There needs to be a change in the relative orientation of polarization of the grid 32 and the grid 36, substantially 90° being best.

It will be appreciated that the defocusing technique will work on a ferrite conical scanner and a meanderline conical scanner by rotating the polarizing grid facing the receiver feed horns. It could also be achieved by a polarization switch in the horn feed by flipping the received polarization by 90°.

Once the apparatus is defocused then the assumption is that all channels measure the same temperature. All radiometers in the array can then be used to measure the temperature and then calculate the average temperature of the defocused bland scene. In this way one would ensure that the uncertainty on the absolute level of the temperature would be minimized. This can be important for absolute calibration.

In some cases it may not be completely true that the radiation temperature over the whole of the bland scene is the same. This may be in security imaging applications where things are very close to the imager. In this case it is possible to make the assumption that adjacent channels are measuring the same temperature. Thus, in the discussion which says that two channels may observe the same point in the scene it is also intended to cover observing nearly the same point close enough so that it is reasonable to assume that the channels are observing the same temperature, or nearly so.

It may also be possible to slightly defocus by moving the "optics" in the axial direction (relative movement of the focusing dish and the horn array). In this case it is also possible to make the assumption that adjacent channels are measuring the same temperature.

To perform the calibration using a single scene temperature, one could solve the 4 equations for the 4 unknowns by performing the defocusing technique on two different radiation temperatures.

Redundancy in detection channels that contribute to an image can be very helpful.

Round-up errors can be minimized by averaging values, and it also allows the system to compensate for failed detectors (e.g. by using signals from working detectors). It also allows for the comparison of the evaluated temperature, as evaluated by more than one channel, so as to identify significantly different estimated temperatures and hence identify potentially failed detectors and/or channels.

As many mm wave imaging systems are polarization sensitive defocusing can also be achieved by the use of a polarization switch. If a polarization switch is provided directly in front of the detector the radiation being detected would be unfocused. The polarizer could be a meanderline arrangement, or a ferrite in fundamental waveguide in the feed. FIG. 12 illustrates this idea.

A further feature which may be provided is the ability to use a change in polarization (or other switch mechanism) to switch the signals incident upon the focal plane receiver feed array from being signals from the observed scene to being from a reference calibration scene. The meanderline plate rotation discussed in relation to FIG. 10 is an example of this.

Single Point Calibration

Another technique which may be employed is a single point relative calibration. This is applicable to absolute calibration and to relative calibration techniques. Traditionally, it is necessary to calibrate two channels for gain and offset by looking at two temperature sources at two different, and known, temperatures. If the temperature of the device is known or is estimated there is effectively one only unknown in the calibration equation instead of two. This means that given an absolute calibration (in-factory) relative calibrations between channels can be performed using emissions from a single source of known temperature.

In single point calibration it is desired to obtain a relative calibration when one can only present to the channels a single temperature. If one only has a single temperature then one only has two equations for four unknowns. The single point calibration makes use of the assumption that says the two unknowns, the gain and offset, are not truly independent. There is in fact a link. Once this is assumed there is only really one unknown for a single channel. The assumption is to say that the thing that links the gain and the offset is the temperature of the system. This is an assumption of course, but a reasonable one. This is because most changes in gain and offset are due to temperature changes. This means one needs to measure the temperature of the system. Then the temperature, the link between the gain and the offset, is known and it is possible to look up the gain and offset relation, and then there is one unknown. So for the single temperature one has two equations and two unknowns.

To use the single point calibration one needs to be sure two adjacent channels have substantially the same input. One way of ensuring this is to defocus.

This single point relative calibration technique can be used with or without the de-focusing technique discussed earlier. The single point calibration technique could be used with the sky, for example, as the single source (or the ground).

The device may have a dedicated channel directed at the single source. This may avoid having to point the entire device at the reference source. For example FIG. 4 shows a dedicated horn 79 directed at the sky. Not having to point the detector array at the reference calibration source means that it is possible to calibrate frequently, for example for each image, or periodically every few, or tens, of images.

It will be appreciated that the calibration of the radiometer will be predominantly in software. This means that the design of the radiometer hardware can be kept robust and simple, and the software can be upgraded as more sophisticated refinements are developed.

Calibrating Each Pixel in an Image Obtained by a Channel

Figure 14B:
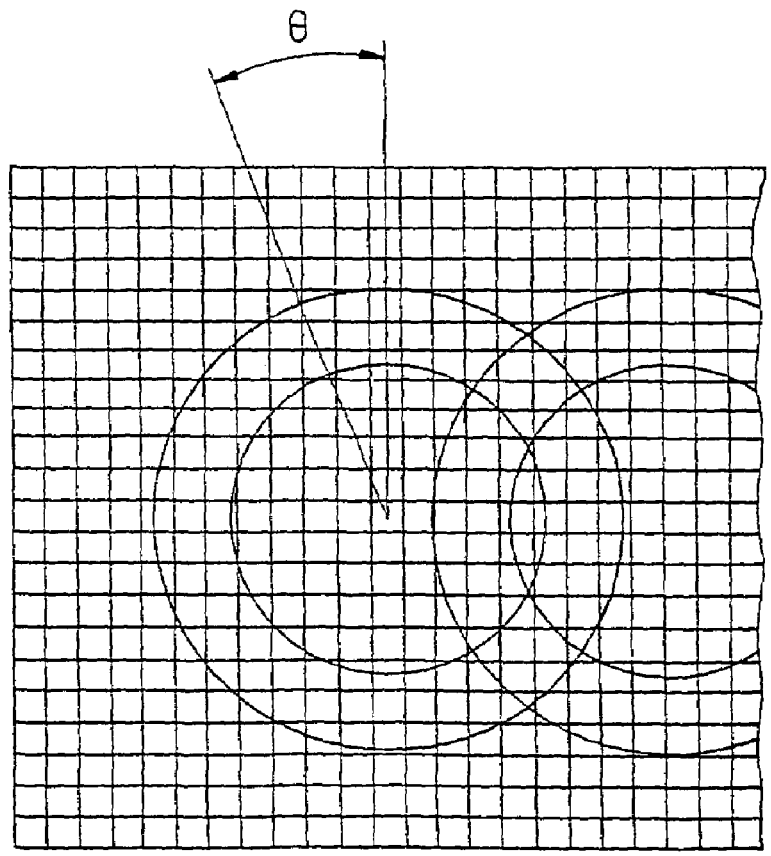
FIG. 14b shows the circular scan pattern transformation to a two dimensional image suitable for presentation on a monitor screen or data storage.

FIG. 14 shows schematically a scene 140 that has been notionally pixellated into pixels 142. Annular scan pattern 144 is the part of the observed scene that is projected, portion by portion over time, onto a single channel feed in the radiometer of FIG. 9 as the inclined disc 93 rotates. Annular scan pattern 146 is the part of the observed scene that is projected in serial sequence onto a second channel feed in the radiometer of FIG. 9 (and as shown in FIG. 9a). Each pixel in the scan path 142 may have a different gain and offset associated with them, for the same channel, due to geometric effects of the instrument. Thus although we have previously discussed a single channel having, at any instant, a single gain and offset with temperature dispandencies, and indeed that is true to a very good approximation, there may be, at a more detailed level, a variation of gain and offset for a channel with scan angle—the angle θ around the scan.

Figure 15A:
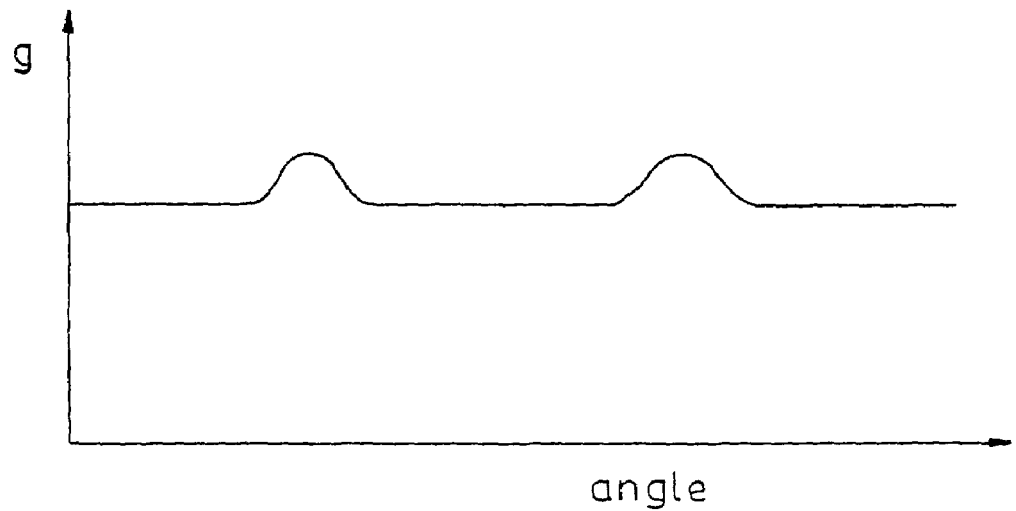
FIGS. 15A and 15B respectively show variation in gain and offset with scan angle θ.
Figure 15B:
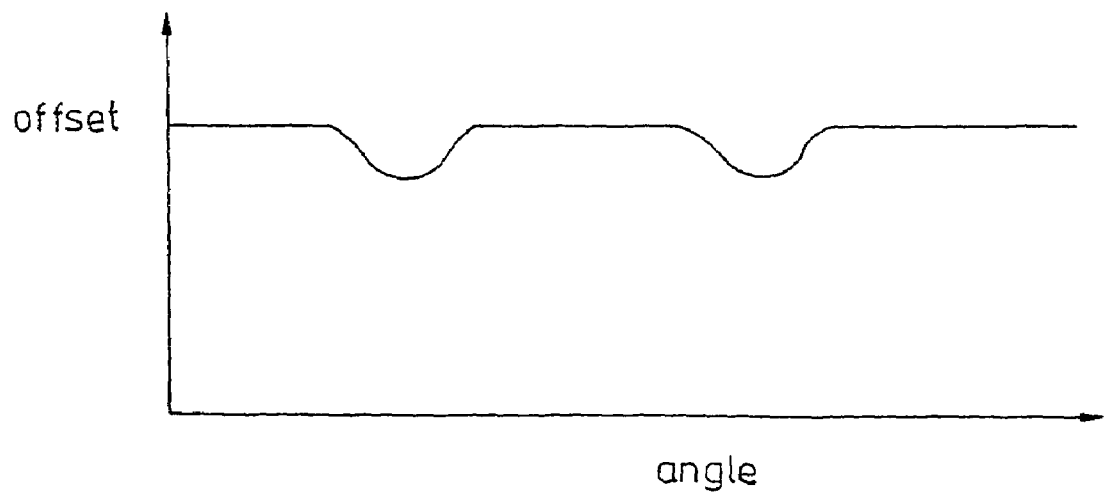

FIGS. 15a and 15b show this. Indeed, there may be two significant "blips" in the gain and offset profiles with angle around the scan (θ), about 180° apart. These may be associated with the base plate which hold the detectors and electrical wires 104 leading to the detector array, which are at 180° diametrically opposed positions.

In order to compensate this effect each angle around the scan, scan angle θ, may have its own associated gain and offset for each channel. These may be factory set (and indeed will usually initially be factory-set). However, as discussed earlier, gain and offset are dependant upon the temperature of the instrument. The gain and offset for each scan angle will also be temperature dependent to some degree. Thus for a conical scanner:

$$V_{(T)} = g(\theta, T) + V_O(\theta, T)$$

When θ is the angle around the scan, and T is the temperature of the radiometer (or at least the temperature of a critical temperature-dependant component).

Absolute calibration of the gain and/or offset of a channel at scan angle θ may be provided. A plurality of absolute calibration of the gains and/or offsets of a channel at different scan angles θ may be provided. Preferably absolute calibration at substantially all values of θ is provided.

It will be appreciated that detecting and compensating for variations in gain and offset of a channel with θ can be achieved by time gating the detected signals so that a "window" opens electronically when the scan angle is at a particular θ, so that the detector essentially only sees scene information at that angle θ. Moving the timing of the gating, relative to the top point of the scan changes the scan angle θ being observed.

It is also desirable to perform relative calibration between two channels with allowance for variations in gain and offset with scan angle θ around the scan. This may be complicated at cross-over points because the scan angle for one channel at the cross-over point may be $\theta_1$, but the scan angle at the cross-over point/region for the other channel will be $\theta_2$—a different angle.

One solution is to determine the variation of gain and offset with scan angle in the factory/laboratory for each channel and to modify the factory settings with relative gain and relative offset values determined in situo, in use of the radiometer, with the relative gain and relative offset compensating for inter-channel variations with temperature being scan angle independent—i.e. the same relative channel compensation for temperature variation irrespective of scan angle, but sensitive to the temperature of the instrument.

An alternative is the other way around: take what has been discussed previously relating to relative calibration (or free standing calibration or absolute calibration) and overlay a modification to gain and offset that is dependant upon the scan angle, but is the same for each channel—i.e. gain (g)→gain+g(θ)

And V offset→V offset+$V_o(\theta)$

A further possibility is to have a set of scan angle dependant modifications for gain and offset for each channel, each modification for each channel being temperature dependent and known.

Applying More than One Calibration Technique

It is envisaged that in one embodiment free standing calibration, and/or absolute calibration and/or relative calibration could be employed, in any combination, and possibly all three. Free standing calibration may be used before relative calibration. The frequency of relative calibration of the channels may be the same as, or more than, or less than, that of free standing calibration of the channels.

Changing Tilt Angle of a Conical Scanner

In a scanner of the kind shown in FIG. 9, where a reflector plate inclined relative to the normal to its axis of rotation is provided, there can be benefits in being able to vary the angle of inclination, or tilt angle, of the reflector plate.

It will be appreciated that the angle φ controls how large is the scan pattern of the imager (for a tilt angle φ the full width of the scanning cone angle is 4φ).

If it were desired to collect information about a central line region in the observed scene (e.g. detail along a horizon, or the central regions of the image) and greater sensitivity were required there, the tilt angle φ could be reduced, thus reducing the conical scan angle. This would increase the amount of data collected along a central line in the image and raise the signal noise ratio in this part of the image.

Conversely, if a wider field of view were required increasing the tilt angle φ would increase the scan angle, at a cost of reduced sensitivity.

Internal Coating

It is envisaged that the internal surfaces of the radiometer could be coated with an energy absorbing coating (absorbing at least in the wavelengths being use for imaging/detection in the radiometer). This prevents spurious radiation spoiling the relationship between incident scene radiation and radiation detected by the detector array. It also helps to reduce the variation of gain and offset with respect to scan angle.

Pixel Integration

For normal operation of the mm wave imager of FIG. 9 the radiometer operates at 25 HZ (i.e. 25 "constructed" frames per second of the scene, built from conical scan paths which substantially fill the region of the scene being observed).

In order to increase the signal to noise ratio when searching for a particular object in the scene, or when looking at a particular region of the observed scene covered by the field of view of the radiometer, the integration time for certain selected pixels of the observed scene could be increased, for example from say a few tens of microseconds to seconds.

This would normally be performed when it was known, or possibly established by the control processor, that the object was not moving relative to the image scene (at least not laterally or vertically).

The area of the observed scene that is looked at for longer (greater integration time) could be determined by the human operator, or alternatively by software (e.g. pattern recognition software could identify a known object, or a suspected object, and the control processor could increase the integration time of the pixels in the area of the object). The degree of increase in pixel integration may be user, or computer, controlled, for example over a range of tens of microseconds to seconds.

It will be appreciated that the various inventions disclosed can be used with each other in any combination, as can the subsidiary features of one invention be used with other inventions. Protection for such combinations is sought.

The invention claimed is:

1. A scanning imaging radiometer comprising:
   scanner components,
   a detector, and
   a control processor adapted to control the operation of the scanner components; wherein the scanner components comprise:
   a focussing element adapted in use to focus radiation onto the detector and having an optical axis,
   a detector field of view director comprising a rotatable inclined reflector plate whose normal is adapted to rotate at an angle inclined to the optical axis, and a quarter wave plate disposed between the reflector plate and the focussing element; and wherein the detector has a detector feed provided disposed between the focussing element and the reflector plate.

2. A radiometer according to claim 1 in which detector feeds are provided between the focussing element and the quarter wave plate.

3. A radiometer according to claim 1 in which the focussing element also comprises a polariser adapted in use to transmit radiation of one polarisation and to reflect an orthogonal polarisation.

4. A radiometer according to claim 1 in which the detector comprises an array having a number of feed elements, each feed element of which is adapted in use to receive radiation from a particular direction in the scene at any instant in time, and in which the control processor is adapted to scan each feed element over parts of the imager field of view.

5. A radiometer according to claim 4 in which the detector array is disposed closer to the focussing element than the quarter wave plate.

6. A radiometer according to claim 1 which comprises a conical scanner which selects circles or annuli in space in a scene being observed and focuses points or sections of the annuli disposed on different annuli onto respective individual detector elements of the detector array, different points or sections on any one annulus being focussed onto the same detector element, but at different moments in time, the conical scanner directing points or sections from a single annulus onto an individual detector element using the field of view director and focussing optics.

* * * * *